(12) United States Patent
Goda et al.

(10) Patent No.: US 7,118,798 B2
(45) Date of Patent: Oct. 10, 2006

(54) POLYIMIDE-METAL LAYERED PRODUCTS AND POLYAMIDEIMIDE-METAL LAYERED PRODUCT

(75) Inventors: Hideki Goda, Osaka (JP); Takayuki Fujiwara, Osaka (JP); Takeshi Takeuchi, Osaka (JP)

(73) Assignee: Arakawa Chemical Industries, Ltd., Osaka (JP)

( * ) Notice: Subject to any disclaimer, the term of this patent is extended or adjusted under 35 U.S.C. 154(b) by 0 days.

(21) Appl. No.: 10/492,669

(22) PCT Filed: Oct. 31, 2002

(86) PCT No.: PCT/JP02/11333

§ 371 (c)(1),
(2), (4) Date: Apr. 15, 2004

(87) PCT Pub. No.: WO03/037620

PCT Pub. Date: May 8, 2003

(65) Prior Publication Data

US 2004/0247907 A1 Dec. 9, 2004

(30) Foreign Application Priority Data

| Nov. 1, 2001 | (JP) | ............................. 2001-336053 |
| Nov. 1, 2001 | (JP) | ............................. 2001-336062 |
| Jun. 4, 2002 | (JP) | ............................. 2002-162636 |
| Jun. 28, 2002 | (JP) | ............................. 2002-189252 |
| Jul. 26, 2002 | (JP) | ............................. 2002-218714 |

(51) Int. Cl.
*B32B 15/00* (2006.01)

(52) U.S. Cl. ....................... 428/209; 428/457; 428/458; 428/901; 428/606; 428/687; 428/446; 428/447; 428/450; 428/473.5; 428/473.4

(58) Field of Classification Search ........ 428/457–458, 428/901, 209, 606, 687, 446–447, 450, 473.5, 428/473.4; 528/419, 39, 405; 429/901
See application file for complete search history.

(56) References Cited

U.S. PATENT DOCUMENTS

| 4,496,794 A | 1/1985 | Darms et al. |
| 4,806,432 A * | 2/1989 | Eguchi et al. .............. 428/457 |
| 4,939,039 A | 7/1990 | Watanabe |
| 5,622,782 A | 4/1997 | Poutasse, III et al. |
| 6,046,072 A * | 4/2000 | Matsuura et al. ............ 438/118 |
| 6,506,868 B1 * | 1/2003 | Goda et al. ................... 528/27 |

FOREIGN PATENT DOCUMENTS

| EP | 0 353 766 | | 2/1990 |
| EP | 0 756 443 | | 1/1997 |
| JP | 04-142327 A | | 5/1992 |
| JP | 04-296317 A | | 10/1992 |
| JP | 06-104542 A | | 4/1994 |
| JP | 08-224843 A | | 9/1996 |
| JP | 11-263912 A | | 9/1999 |
| JP | 11-274716 A | | 10/1999 |
| JP | 2000-198855 A | | 7/2000 |
| JP | WO-01/05862 | * | 1/2001 |
| JP | 2001-234020 A | | 8/2001 |
| JP | 2001/240670 A | | 9/2001 |
| JP | 2002-069419 | | 3/2002 |
| JP | 2002-293933 A | | 10/2002 |

OTHER PUBLICATIONS

Morikawa, Atsushi, et al., *Polymer Journal*, vol. 24, No. 1, pp. 107-113 (1992) "Preparation of a New Class of Polyimide-Silica Hybrid Films by Sol-Gel Process."

Miki, Norihiko, et al., *Kobunshi Ronbunshu*, vol. 57, No. 4, pp. 233-243 (2000) "Effect of Precursor Solvent on the Copper Migration Behavior at the (Polyimide/Copper) Interface."

Wang, Shuhong, et al., *Macromolecular Reports*, A31(Suppls. 3&4), pp. 411-419 (1994) "Polyimide-Silica Hybrid Materials Having Interfacial Bonding Through Use of a Sol-Gel Technique."

* cited by examiner

*Primary Examiner*—Ling Xu
(74) *Attorney, Agent, or Firm*—Knobbe Martens Olson & Bear LLP

(57) ABSTRACT

The present invention provides the following three laminates: First, a polyimide-metal laminate which is obtainable by applying to one side of a metal foil a silane-modified polyimide resin composition (A) comprising alkoxy-containing silane-modified polyimide (a) and a polar solvent (b), drying and curing the composition; Second, a polyamideimide-metal laminate which is obtainable by applying to one side of a metal foil a silane-modified polyamideimide resin composition (C-1) comprising methoxy-containing silane-modified polyamideimide (d), a polar solvent (b) and an inorganic filler (c), drying and curing the composition; and third, a polyimide-metal laminate in which the cured film of the above composition (A) has a metal plated layer thereon.

21 Claims, No Drawings

POLYIMIDE-METAL LAYERED PRODUCTS AND POLYAMIDEIMIDE-METAL LAYERED PRODUCT This application is the U.S. National Phase under 35 U.S.C. §371 of International Application PCT/JP02/11333, filed on Oct. 31, 2002, which claims priority of Japanese Patent Application Nos. 2001-336053, 2001-336062, 2002-162636, 2002-189252 and 2002-218714, filed on Nov. 1, 2001, Nov. 1, 2001, Jun. 4, 2002, Jun. 28, 2002 and Jul. 26, 2002 respectively. The International Application was published under PCT Article 21(2) in a language other than English.

TECHNICAL FIELD

The present invention relates to a polyimide-metal laminate and a polyamideimide-metal laminate.

BACKGROUND ART

In recent years, electric appliances and electronic apparatuses are becoming increasingly lightweight and compact. Circuit boards, used as components of electric appliances and electronic apparatuses, are also required to be miniaturized and given higher densities because of this trend.

To achieve the miniaturization of circuit boards, polyimide films have been widely used as materials in such boards because they are inexpensive and have excellent physical properties such as electrical properties, thermal resistance, flexibility, etc. They are used for flexible printed circuit boards, tape-automated bonding tapes, chip-on-film and other substrates.

When used as materials for substrates such as flexible printed circuit boards (hereinafter abbreviated as "FPC"), tape-automated bonding tapes (hereinafter abbreviated as "TAB") and chip-on-films (hereinafter abbreviated as "COF"), polyimide films are usually adhered to copper foils using adhesives such as epoxy resin, and formed into a laminate. However, such laminates do not fully exhibit the inherent characteristics of polyimides because the thermal resistance and other properties of the adhesives are lower than those of the polyimide.

Some methods for producing laminates without using poorly thermal-resistant adhesives have been suggested. One such method forms a polyimide-copper foil laminate by applying a polyamic acid solution onto a copper foil and drying the solution to convert it to the corresponding polyimide. Another such method forms a polyimide-copper foil laminate by the thermocompressive bonding of a polyimide film to a copper foil. Adhesion between the polyimide layer and copper foil in these polyimide-copper foil laminates is low. Therefore, it is difficult to use a copper foil with a smooth surface (low surface roughness) for such laminates, which is necessary for fine pitching and to handle high frequencies. In addition, the problem is reported in terms of deteriorated heat resistance in such laminates.

Kobunshi Ronbunsyu (Japanese Journal of Polymer Science and Technology) 2000, vol. 57, No. 4, 233 describes the following: when a polyamic acid is directly applied onto a base material, e.g., a copper foil, to allow conversion to the polyimide, copper ions tends to migrate into the polyimide near the copper foil interface, thereby the insulation of the polyimide layer may be decreased. Increasing the thickness of the polyimide layer to ensure sufficient insulation, however, is unfavorable because it prevents an increase in density of electronic circuitry. Therefore, the development of a metal foil laminate which can effectively inhibit the migration of copper ions in a thin film is required.

Polyamideimide-copper foil laminates are known, which are produced by forming a conventional polyamideimide film layer on a copper foil by coating method, thermocompressive bonding method or the like. The adhesion of a polyamideimide layer to a copper foil is superior to that of a polyimide. However, its adhesion is still insufficient. In addition, such laminates have problems with high water absorption, low dimensional stability and poor electrical insulative properties such as dielectric constant. Therefore, such laminates are not suitable as materials for substrates such as FPC, TAB, COF, etc.

DISCLOSURE OF THE INVENTION

An object of the present invention is to provide a polyimide-metal or polyamideimide-metal laminate in which the adhesion between the polyimide layer or polyamideimide layer and the metal layer is high, and the polyimide layer or polyamideimide layer allows little migration of copper ions thereinto.

Other objects and features of the present invention will be apparent from the following description.

As a result of extensive research, the inventors of the present invention found that the above object can be achieved by a polyimide-metal laminate or polyamideimide-metal laminate obtainable by the following method: applying a specific silane-modified polyimide resin composition or a silane-modified polyamideimide resin composition to a metal foil; or forming a metal layer on a film of the above polyimide resin composition by metal plating. The present invention was accomplished based on these findings and further investigations.

The present invention provides the following polyimide-metal laminates and polyamideimide-metal laminates:

Item 1. A polyimide-metal laminate that is obtainable by:

applying to one side of a metal foil a silane-modified polyimide resin composition (A) comprising alkoxy-containing silane-modified polyimide (a) prepared by reacting polyamic acid (1) and/or polyimide (2) with epoxy-containing alkoxysilane partial condensate (3), and a polar solvent (b); and drying the applied composition and curing the dried composition.

Item 2. A polyimide-metal laminate according to item 1, wherein said polyamic acid (1) and/or polyimide (2) has a percentage of imide cyclization of at least 90%.

Item 3. A polyimide-metal laminate according to item 1, wherein the silane-modified polyimide resin composition (A) further comprises an inorganic filler (c).

Item 4. A polyimide-metal laminate which is obtainable by further applying a polyimide resin composition (B) comprising polyimide which forms a film having a coefficient of linear expansion of 25 ppm or less and a polar solvent (b) to the polyimide layer of the metal laminate of item 1, drying the applied composition and curing the dried composition.

Item 5. A polyimide-metal laminate which is obtainable by further applying a silane-modified polyimide resin composition (A) which forms a film having a coefficient of linear expansion of 25 ppm or less to the polyimide layer of the metal laminate of item 1, drying the applied composition and curing the dried composition.

Item 6. A polyimide-metal laminate having metal layers on both surfaces wherein the metal layer on the olyimide side is formed by metal plating the polyimide film of polyimide-metal laminate of item 1.

Item 7. A polyimide-metal laminate according to item 6, wherein the metal plating is copper plating.

Item 8. A polyimide-metal laminate according to item 1, wherein the curing temperature of the silane-modified polyimide resin composition (A) is 150–500° C.

Item 9. A polyimide-metal laminate according to item 1, wherein the metal foil is an electrolytic copper foil or a rolled copper foil having a surface roughness (Rz) of 7 or lower and a foil thickness of 70 μm or smaller.

Item 10. A polyimide-metal laminate which is obtainable by applying to a carrier film a silane-modified polyimide resin composition (A) comprising alkoxy-containing silane-modified polyimide (a) prepared by reacting polyamic acid (1) and/or polyimide (2) with epoxy-containing alkoxysilane partial condensate (3), and a polar solvent (b), drying the applied composition, peeling off and curing the dried composition, and metal plating one side or both sides of the obtained cured polyimide film.

Item 11. A polyimide-metal laminate according to item 10, wherein the silane-modified polyimide resin composition (A) further comprises an inorganic filler (c).

Item 12. A polyimide-metal laminate according to item 10, wherein the curing temperature of the silane-modified polyimide resin composition (A) is 150–500° C.

Item 13. A polyimide-metal laminate according to item 10, wherein the metal plating is copper plating.

Item 14. A polyamideimide-metal laminate that is obtainable by:

applying to one side of a metal foil a silane-modified polyamideimide resin composition (C-1) comprising methoxy-containing silane-modified polyamideimide (d) prepared by reacting polyamideimide (4) having a carboxyl group and/or an acid anhydride group at its ends with a glycidyl ether group-containing methoxysilane partial condensate (5) obtained by demethanolization reaction between glycidol and a methoxysilane partial condensate, a polar solvent (b) and an inorganic filler (c);

drying the applied composition and curing the dried composition.

Item 15. A polyamideimide-metal laminate according to item 14, wherein the glycidyl ether group-containing methoxysilane partial condensate (5) is obtainable by demethanolization reaction between glycidol and a methoxysilane partial condensate having an average number of silicon atoms per molecule of 2–100.

Item 16. A polyamideimide-metal laminate according to item 14, wherein the methoxy-containing silane-modified polyamideimide (d) after curing has a silica content in the cured residue of 1% by weight to less than 15% by weight.

Item 17. A polyamideimide-metal laminate according to item 14, wherein the polyamideimide layer formed on the metal foil has a percentage of water absorption of less than 3% by weight and a dielectric constant at 1 kHz of 3.5 or lower.

Item 18. A polyamideimide-metal laminate according to item 14, wherein the polyamideimide layer formed on the metal foil has a coefficient of linear expansion of 15–30 ppm.

Item 19. A polyamideimide-metal layer according to item 14, wherein the metal foil is an electrolytic copper foil or a rolled copper foil having a surface roughness (Rz) of 7 or lower and a film thickness of 70 μm or smaller.

Item 20. A polyamideimide-metal laminate according to item 14, wherein the curing temperature of the silane-modified polyamideimide resin composition (C-1) is 200–350° C.

Item 21. A polyamideimide-metal laminate according to item 14, wherein the laminate is a material for a flexible printed circuit board.

Item 22. A polyamideimide-metal laminate that is obtainable by:

applying to one side of a metal foil a silane-modified polyamideimide resin composition (C-2) comprising methoxy-containing silane-modified polyamideimide (d) prepared by reacting polyamideimide (4) having terminal carboxyl groups and/or an acid anhydride groups with glycidyl ether group-containing methoxysilane partial condensate (5) obtained by demethanolization reaction between glycidol and a methoxysilane partial condensate, and a polar solvent (b);

drying the applied composition and curing the dried composition;

further applying a silane-modified polyamideimide resin composition (C-1) comprising methoxy-containing silane-modified polyamideimide (d), a polar solvent (b) and an inorganic filler (c) to the resulting polyamideimide layer on the polyamideimide-metal laminate; and drying the applied composition and curing the dried composition.

Item 23. A polyamideimide-metal laminate according to item 22, wherein the glycidyl ether group-containing methoxysilane partial condensate (5) is obtainable by demethanolization reaction between glycidol and a methoxysilane partial condensate having an average number of silicon atoms per molecule of 2–100.

Item 24. A polyamideimide-metal laminate according to item 22, wherein the methoxy-containing silane-modified polyamideimide (d) after curing has a silica content in a cured residue of 1% by weight to less than 15% by weight.

Item 25. A polyamideimide-metal laminate according to item 22, wherein the polyamideimide layer formed on the metal foil has a percentage of water absorption of less than 3% by weight and a dielectric constant at 1 kHz of 3.5 or lower.

Item 26. A polyamideimide-metal laminate according to item 22, wherein the polyamideimide layer formed on the metal foil has a coefficient of linear expansion of 15–30 ppm.

Item 27. A polyamideimide-metal laminate according to item 22, wherein the metal foil is an electrolytic copper foil or a rolled copper foil having a surface roughness (Rz) of 7 or lower and a thickness of 70 μm or smaller.

Item 28. A polyamideimide-metal laminate according to item 22, wherein the curing temperatures of the silane-modified polyamideimide resin compositions (C-1) and (C-2) are in the range of 200–350° C.

Item 29. A polyamideimide-metal laminate according to item 22, wherein the laminate is a material for producing a flexible printed circuit board.

Polyimide-Metal Laminate

The polyimide-metal laminate of the present invention has the following two forms:

(1) Polyimide-metal laminate I obtained by applying to one side of a metal foil the above silane-modified polyimide resin composition (A), drying and curing the composition.

(2) Polyimide-metal laminate II obtained by applying the silane-modified polyimide resin composition (A) to a carrier film, drying, peeling off and curing the composition, and metal plating one side or both sides of the cured polyimide film.

The silane-modified polyimide resin composition (A) comprises alkoxy-containing silane-modified polyimide (a) and a polar solvent (b). The alkoxy-containing silane-modified polyimide (a) is obtained by reacting polyamic acid (1) and/or polyimide (2) with an epoxy-containing alkoxysilane partial condensate (3).

Polyamic acid (1) is a resin whose main chain is formed by amide bonds, and which has carboxyl groups which can react with the amide bonds to form imide bonds. An example of a useful polyamic acid is in the form of a polyamic acid solution that can be prepared by reacting a tetracarboxylic acid and a diamine in polar solvent (b).

Polyimide (2) can be easily and directly prepared by reacting tetracarboxylic acid and diamine in a suitable combination in polar solvent (b). The polyimide (2) can also be obtained by dehydrative cyclization of polyamic acid (1) in polar solvent (b).

The molecular weight of the polyamic acid (1) and/or polyimide (2) is not limited. It preferably has a number average molecular weight of about 3,000 to about 50,000.

Examples of tetracarboxylic acids include pyromellitic anhydride, 1,2,3,4-benzene tetracarboxylic anhydride, 1,4,5,8-naphthalene tetracarboxylic anhydride, 2,3,6,7-naphthalene tetracarboxylic anhydride, 3,3',4,4'-biphenyl tetracarboxylic dianhydride, 2,2',3,3'-biphenyl tetracarboxylic dianhydride, 2,3,3',4'-biphenyl tetracar-boxylic dianhydride, 3,3',4,4'-benzophenone tetracarboxylic dianhydride, 2,3,3',4'-benzophenone tetracarboxylic dianhydride, 3,3',4,4'-diphenyl ether tetracarboxylic dianhydride, 2,3,3',4'-diphenyl ether tetracarboxylic dianhydride, 3,3',4,4'-diphenyl sulfone tetracarboxylic dianhydride, 2,3,3',4'-diphenyl sulfone tetracarboxylic dianhydride, 2,2-bis(3,3',4,4'-tetracarboxyphenyl)tetrafluoropropane dianhydride, 2,2'-bis(3,4-dicarboxyphenoxyphenyl)sulfone dianhydride, 2,2-bis(2,3-dicarboxyphenyl)propane dianhydride, 2,2-bis(3,4-dicarboxyphenyl)propane dianhydride, cyclopentane tetracarboxylic anhydride, butane-1,2,3,4-tetracarboxylic acid, 2,3,5-tricarboxycyclopentyl acetic anhydride and the like. These can be used singly or in combination.

Other acids may also be used additionally within the range which does not adversely affect the effects of the invention. Examples of additionally usable acids include tricarboxylic acids such as trimellitic anhydride, butane-1,2,4-tricarboxylic acid, naphthalene-1,2,4-tricarboxylic acid; oxalic acid, malonic acid, succinic acid, glutaric acid, adipic acid, pimelic acid, suberic acid, sebacic acid, undecanedioic acid, dodecanedioic acid, tridecanedioic acid and other aliphatic dicarboxylic acids and their anhydrides; aromatic dicarboxylic acids such as isophthalic acid, terephthalic acid, diphenylmethane-4,4'-dicarboxylic acid and their anhydrides, etc. Use in too great an amount of the additional acid relative to the tetracarboxylic acid tends to lower the insulative property and thermal resistance of the resulting cured product. Therefore, the amount of such additional acid is usually 30 mol % or lower, relative to the tetracarboxylic acid.

Examples of the diamines mentioned above include the following, which can be used singly or in combination:

p-phenylenediamine, m-phenylenediamine, 3,3'-diaminodiphenyl ether, 3,4'-diaminodiphenyl ether, 4,4'-diaminodiphenyl ether, 3,3'-diaminodiphenylsulfide, 3,4'-diaminodiphenylsulfide, 4,4'-diaminodiphenylsulfide, 3,3'-diaminodiphenylsulfone, 3,4'-diaminodiphenylsulfone, 4,4'-diaminodiphenylsulfone, 3,3'-diaminobenzophenone, 4,4'-diaminobenzophenone, 3,4'-diaminobenzophenone, 3,3'-diaminodiphenylmethane, 4,4'-diaminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,1-di(3-aminophenyl)-1-phenylethane, 1,1-di(4-aminophenyl)-1-phenylethane, 1-(3-aminophenyl)-1-(4-aminophenyl)-1-phenylethane, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl)benzene, 1,4-bis(4-aminobenzoyl)benzene, 1,3-bis(3-amino-$\alpha,\alpha$-dimethylbenzyl)benzene, 1,3-bis(4-amino-$\alpha,\alpha$-dimethylbenzyl)benzene, 1,4-bis(3-amino-$\alpha,\alpha$-dimethylbenzyl)benzene, 1,4-bis(4-amino-$\alpha,\alpha$-dimethylbenzyl)benzene, 1,3-bis(3-amino-$\alpha,\alpha$-ditrifluoromethylbenzyl)benzene, 1,3-bis(4-amino-$\alpha,\alpha$-ditrifluoromethylbenzyl)benzene, 1,4-bis(3-amino-$\alpha,\alpha$-ditrifluoromethylbenzyl)benzene, 1,4-bis(4-amino-$\alpha,\alpha$-ditrifluoromethylbenzyl)benzene, 2,6-bis(3-aminophenoxy)benzo-nitrile, 2,6-bis(3-aminophenoxy)pyridine, 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-amino-phenoxy)phenyl]sulfone, bis[4-(4-aminophenoxy)phenyl]sulfone, bis[4-(3-aminophenoxy)phenyl] ether, bis[4-(4-aminophenoxy)phenyl] ether, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,3-bis[4-(3-aminophenoxy)benzoyl]benzene, 1,3-bis[4-(4-aminophenoxy)benzoyl]benzene, 1,4-bis[4-(3-aminophenoxy)benzoyl]benzene, 1,4-bis[4-(4-aminophenoxy)benzoyl]benzene, 1,3-bis[4-(3-aminophenoxy)-$\alpha,\alpha$-dimethylbenzyl]benzene, 1,3-bis[4-(4-aminophenoxy)-$\alpha,\alpha$-dimethylbenzyl]benzene, 1,4-bis[4-(3-aminophenoxy)-$\alpha,\alpha$-dimethylbenzyl]benzene, 1,4-bis[4-(4-aminophenoxy)-$\alpha,\alpha$-dimethylbenzyl]benzene, 4,4'-bis[4-(4-aminophenoxy)benzoyl]diphenyl ether, 4,4'-bis[4-(4-amino-$\alpha,\alpha$-dimethylbenzyl)phenoxy]benzophenone, 4,4'-bis[4-(4-amino-$\alpha,\alpha$-dimethylbenzyl)phenoxy]diphenylsulfone, 4,4'-bis[4-(4-aminophenoxy)phenoxy]diphenylsulfone, 3,3'-diamino-4,4'-diphenoxybenzophenone, 3,3'-diamino-4,4'-dibiphenoxybenzophenone, 3,3'-diamino-4-phenoxybenzophenone, 3,3'-diamino-4-biphenoxybenzophenone, 6,6'-bis(3-aminophenoxy)3,3,3,'3,'-tetramethyl-1,1'-spirobiindan, 6,6'-bis(4-aminophenoxy)3,3,3,'3,'-tetramethyl-1,1'-spirobiindan, 1,3-bis(3-aminopropyl)tetramethyldisiloxane, 1,3-bis(4-aminobutyl)tetramethyldisiloxane, $\alpha,\omega$-bis(3-aminopropyl)polydimethylsiloxane, $\alpha,\omega$-bis(3-aminobutyl)polydimethylsiloxane, bis(aminomethyl) ether, bis(2-aminoethyl) ether, bis(3-aminopropyl) ether, bis(2-aminomethoxy)ethyl] ether, bis[2-2-aminoethoxy)ethyl] ether, bis[2-(3-aminopropoxy)ethyl] ether, 1,2-bis(aminomethoxy)ethane, 1,2-bis(2-aminoethoxy)ethane, 1,2-bis[2-(aminomethoxy)ethoxy]ethane, 1,2-bis[2-(2-aminoethoxy)ethoxy]ethane, ethyleneglycol bis(3-aminopropyl) ether, diethyleneglycol bis(3-aminopropyl) ether, triethyleneglycol bis(3-aminopropyl) ether, ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane, 1,2-diamino-cyclohexane, 1,3-diaminocyclohexane, 1,4-diaminocyclohexane, 1,2-di(2-aminoethyl)cyclohexane, 1,3-di(2-amino-ethyl)cyclohexane, 1,4-di(2-aminoethyl)cyclohexane, bis(4-aminocyclohexyl)methane, 2,6-bis(amino-methyl)bicyclo[2.2.1]heptane, 2,5-bis(amino-methyl)bicyclo[2.2.1]heptane, etc.

In addition to these diamines, triamines such as 3,4,4'-triaminodiphenyl ether, 2,3,6-triaminopyridine, etc.; and tetraamines can be jointly used within the range which does not adversely affect the effects of the invention, usually in an amount of 5 mol % or less relative to the total amount of amines. Using triamine and/or tetraamine imparts a branched structure to the resulting polyimide (2), and increases the number of carboxyl groups and/or acid anhydride groups at the ends of the resin molecules, thereby increasing the number of reactive sites of the resin with the epoxy-containing alkoxysilane partial condensate (3).

Also usable as a tetracarboxylic acid or diamine are polyimide adducts that have terminal carboxylic anhydride groups or amino groups. The polyimide adduct can be prepared by reacting the above-mentioned tetracarboxylic acid with the above-mentioned diamine at a tetracarboxylic acid/diamine molar ratio of about 0.5:1 to 2:1.

The polyamic acid (1) and/or polyimide (2) can be prepared by reacting the above-mentioned tetracarboxylic acid with diamine in polar solvent (b) at a tetracarboxylic acid/diamine molar ratio from 0.9:1 to 1.1:1, and, if necessary, heating the resulting polyamic acid solution.

Polar solvent (b) is not limited as long as it can dissolve the resulting polyamic acid (1) and/or polyimide (2). Examples include N-methyl-2-pyrrolidone, dimethyl formamide, dimethyl acetamide, cresol, dimethyl sulfoxide, N-methyl caprolactam, methyl triglyme, methyl diglyme and benzyl alcohol. These may be used singly or in combination. In addition to polar solvent (b), nonpolar solvent(s) such as xylene, toluene and the like may be used in an amount of 30% by weight or less relative to the total amount of solvents.

The preferred amount of polar solvent (b) used is such that the amount of cured residue calculated as polyimide is 5–40% by weight. The cured residue calculated as polyimide is a solid content of polyimide when the polyamic acid (1) and/or polyimide (2) has been cured and completely converted to polyimide. The solid content is calculated as a percentage weight of polyimide when cured relative to the solution as a whole. When the cured residue calculated as polyimide is less than 5% by weight, the production cost of the solution of polyamic acid (1) and/or polyimide (2) in the polar solvent becomes high. In contrast, when it is greater than 40% by weight, the solution of the polyamic acid (1) and/or polyimide (2) becomes highly viscous at room temperature and thus the solution tends to be difficult to handle.

Polyamic acid (1) can be prepared by suitably combining tetracarboxylic acid and diamine and reacting them in polar solvent (b) at about −20 to about 60° C. for about 0.1 to about 5 hours.

Polyimide (2) can be easily and directly prepared by combining tetracarboxylic acid and diamine suitably, and allowing them to react in polar solvent (b). The reaction temperature is usually about 80 to about 250° C., and preferably about 100 to about 200° C. The reaction time is usually about 0.5 to about 50 hours, and preferably about 1 to about 12 hours. Optionally, a catalyst may be added, which is selected from aliphatic tertiary amines such as triethylamine; aromatic tertiary amines such as dimethylaniline; and heterocyclic tertiary amines such as pyridine, picoline, isoquinoline and the like. An appropriate amount of catalyst used is about 0.1 to about 100 mol per mol of imide bonds to be formed.

Polyimide (2) can be also prepared by dehydrative cyclization of the above-mentioned polyamic acid (1) in polar solvent (b). The dehydrative cyclization is usually performed at about 80 to about 250° C., and preferably at about 100 to about 250° C. The reaction time is usually about 0.5 to about 50 hours, and preferably about 1 to about 12 hours. In the dehydrative cyclization, a dehydrating agent and a catalyst may be used. Examples of dehydrating agents include aliphatic acid anhydrides such as acetic anhydride, and aromatic acid anhydrides. Examples of catalysts include those mentioned above, i.e., aliphatic tertiary amines, aromatic tertiary amines and heterocyclic tertiary amines. An appropriate amount of dehydrating agent used is about 0.1 to about 100 mol per mol of imide bonds to be formed. An appropriate amount of catalyst used is about 0.1 to about 100 mol per mole of imide bonds to be formed.

Polyimide (2) preferably has such a high degree of cyclization to imide ring by dehydrative cyclization but is not so high that turbidity or precipitation occurs in the solution of polyamic acid (1). This is because partial imidization can decrease the shrinkage of the film on curing and prevent warpage or curling in a laminate of the film with a metal foil.

The epoxy-containing alkoxysilane partial condensate (3) for use in the present invention can be obtained by the dealcoholization reaction between an epoxy compound having one hydroxyl group per molecule and an alkoxysilane partial condensate. For example, it can be synthesized by the method disclosed in Japanese Unexamined Patent Publication No. 2001-114894.

The number of epoxy groups in the epoxy compound is not limited as long as the epoxy compound has one hydroxyl group. The lower the molecular weight of the epoxy compound, the higher the compatibility with the alkoxysilane partial condensate, thermal resistance and ability to impart adhesion. Therefore, an epoxy compound which has 15 or fewer carbon atoms is preferable.

Examples of the epoxy compound include monoglycidyl ethers with a terminal hydroxyl group which are prepared by allowing epichlorohydrin and dihydric alcohol or phenol having two hydroxyl groups to react; polyglycidyl ethers with a terminal hydroxyl group which are prepared by allowing epichlorohydrin and trihydric- or higher polyhydric alcohol such as glycerol and pentaerythritol to react; epoxy compounds with a terminal hydroxyl group which are prepared by allowing epichlorohydrin and an aminomonoalcohol to react; and alicyclic hydrocarbon monoepoxides having one hydroxyl group within a molecule (e.g., epoxidized tetrahydrobenzyl alcohol). Among these epoxy compounds, glycidol is most suitable since it is capable of imparting the highest thermal resistance to the desired polymer and it also has high reactivity with alkoxysilane partial condensates.

The alkoxysilane partial condensate to be used is a substance that can be prepared, in the presence of an acidic or a basic catalyst and water, by hydrolyzing and partially condensing a hydrolysable alkoxysilane monomer represented by formula (1), $$R^1{}_m Si(OR^2)_{4-m} \qquad (1)$$

wherein m is 0 or 1; $R_1$ represents an alkyl group having 8 or less carbon atoms or aryl group; and $R_2$ represents a lower alkyl group having 4 or less carbon atoms.

Examples of hydrolyzable alkoxysilane monomers which are a component material of the alkoxysilane partial condensate include tetraalkoxysilanes such as tetramethoxysilane, tetraethoxysilane, tetrapropoxysilane, tetraisopropoxysilane and the like; trialkoxysilanes such as methyltrimethoxysilane, methyltriethoxysilane, methyltripropoxysilane, methyltributoxysilane, ethyltrimethoxysilane, ethyltriethoxysilane, n-propyltrimethoxysilane, n-propyltriethoxysilane, isopropyltrimethoxysilane, isopropyltriethoxysilane and the like. Preferable among such partial condensates are those synthesized by using at least 70 mol % of tetramethoxysilane or methyltrimethoxysilane because of their high reactivity with glycidol.

The number average molecular weight of the alkoxysilane partial condensate is preferably about 230 to about 2,000, and the average number of silicon atoms in each molecule is preferably about 2 to about 11.

The ratio of epoxy compound to alkoxysilane partial condensate used is not restricted as long as it allows alkoxy groups to remain in a substantial amount. Usually, in the starting materials, the ratio of the hydroxyl equivalents of the epoxy compound to alkoxy equivalents of the alkoxysilane partial condensate is 0.01:1–0.5:1. This ratio is preferable for the dealcoholization reaction to proceed smoothly between the alkoxysilane partial condensate and the epoxy compound.

The dealcoholization reaction between the alkoxysilane partial condensate and epoxy compound is performed, for example, by mixing the starting materials and heating the mixture while removing the generated alcohol. The reaction temperature is usually about 50 to about 150° C., and preferably 70 to 110° C. The total reaction time is about 1 to about 15 hours.

The alkoxy-containing silane-modified polyimide (a) is prepared by reacting the polyamic acid (1) and/or polyimide (2) with the epoxy-containing alkoxysilane partial condensate (3). The ratio of the polyamic acid (1) and/or polyimide (2) and the epoxy-containing alkoxysilane partial condensate (3) is not restricted. The ratio of (epoxy equivalents of the epoxy-containing alkoxysilane partial condensate (3)) to (carboxyl equivalents of the tetracarboxylic acids used for producing the polyamic acid (1) and/or polyimide (2)) preferably ranges from 0.01–0.3:1. When this ratio is lower than 0.01:1, sufficient adhesion between the polyimide layer and the metal foil is hard to obtain. When the ratio is higher than 0.3:1, the polyimide layer tends to be brittle.

The alkoxy-containing silane-modified polyimide (a) can be prepared, for example, by mixing the above starting materials, and heating the mixture under substantially anhydrous conditions to react. The main purpose of this reaction is to cause a reaction between a carboxyl group of polyamic acid (1) or terminal acid anhydride group or amino group in polyimide (2), and an epoxy group of the epoxy-containing alkoxysilane partial condensate (3). For this reason, it is necessary to suppress the formation of silica due to sol-gel reaction at the alkoxy site of epoxy-containing alkoxysilane partial condensate (3) and cyclization reactions within the polyamic acid to produce imides during this reaction stage. Accordingly, the reaction temperature is usually about 50 to about 120° C., preferably 60 to 100° C., and the total reaction time is preferably about 1 to about 30 hours.

In the above dealcoholization reaction, a catalyst may be used to promote the reaction. The catalyst may be known one used for reactions between an epoxy group and a carboxyl, acid anhydride or amino group.

Examples of such catalysts include tertiary amines such as 1,8-diaza-bicyclo[5,4,0]-7-undecene, triethylenediamine, benzyldimethylamine, triethanolamine, dimethylaminoethanol, tris(dimethylaminomethyl)phenol and the like; imidazoles such as 2-methylimidazole, 2-phenylimidazole, 2-phenyl-4-methylimidazole, 2-heptadecylimidazole, benzimidazole and the like; organophosphines such as tributylphosphine, methyl-diphenylphosphine, triphenylphosphine, diphenylphosphine, phenylphosphine and the like; tetraphenyl borate salts such as tetraphenylphosphonium.tetraphenyl borate, 2-ethyl-4-methylimidazole.tetraphenyl borate, N-methylmorpholine.tetraphenyl borate and the like. The catalyst is preferably used in an amount of about 0.01 to about 5 parts by weight per 100 parts by weight of the cured residue calculated as polyimide of polyamic acid.

The aforementioned dealcoholization reaction is preferably performed in polar solvent (b). The polar solvent (b) is not restricted as long as it dissolves the polyamic acid (1) and/or polyimide (2), and the epoxy-containing alkoxysilane partial condensate (3). Examples of such solvents include those which are used for preparing polyamic acid (1).

The above dealcoholization reaction produces the silane-modified polyimide resin composition (A) comprising the alkoxy-containing silane-modified polyimide (a) and the polar solvent (b). The preferable amount of the solid resin content of the alkoxy-containing silane-modified polyimide (a) in the composition is about 5 to about 40% by weight. If necessary, to adjust the solid resin content within this range, a suitable amount of polar solvent (b) can be added.

The alkoxy-containing silane-modified polyimide (a) has alkoxy groups derived from the alkoxysilane partial condensate. The amount of alkoxy groups contained is not limited. However, the alkoxy groups are necessary to form a mutually bonded cured product by evaporation of polar solvent (b), heat-treatment or contact with water/moisture to cause sol-gel reaction and dealcoholization. Therefore, usually 50–95 mol %, and preferably 60–90 mol %, of the alkoxy groups, based on the alkoxy groups in the alkoxysilane partial condensate (3), are left unreacted in the alkoxy-containing silane-modified polyimide (a).

The cured product prepared from the alkoxy-containing silane-modified polyimide (a) is a polyimide-silica hybrid. This cured product has gelated fine silica portions (higher network structure of siloxane bonds) represented by formula (2)

$$R^1{}_m SiO_{(4-m)/2} \qquad (2)$$

wherein m is 0 or 1 and $R^1$ represents an alkyl group having 8 or less carbon atoms or aryl group.

The silane-modified polyimide resin composition (A) for use in the present invention may contain unreacted polyamic acid (1), polyimide (2), alkoxysilane partial condensate, epoxy-containing alkoxysilane partial condensate (3), reaction solvent, catalyst, etc., in addition to the alkoxy-containing silane-modified polyimide (a). While being cured, the unreacted alkoxysilane partial condensate and epoxy-containing alkoxysilane partial condensate (3) undergo hydrolysis and polycondensation. As a result, they are converted to a product containing silica and integrated with the product of the alkoxy-containing silane-modified polyimide, thereby giving a cured polyimide-silica hybrid.

In order to prevent curling of the metal foil laminate, a known inorganic filler (c) may be added to the alkoxy-containing silane-modified polyimide resin composition of the invention. Usable as an inorganic filler are oxides such as silica, alumina, titania and magnesium oxide; complex oxides such as kaolin, talc and montmorillonite; carbonates such as calcium carbonate and barium carbonate; sulfates such as calcium sulfate and barium sulfate; titanates such as barium titanate and potassium titanate; phosphates such as tricalcium phosphate, dicalcium phosphate and monocalcium phosphate; however, it is not restricted to these examples. Among these inorganic fillers (c), silica is the most favorably used considering the stability of the alkoxy-containing silane-modified polyimide resin composition (B), the dispersibility thereof, and its effects in preventing curling.

Usually, the average particle diameter of inorganic filler (c) preferably ranges from 0.01 µm to 5 µm. A preferable amount of inorganic filler (c) added is 50% by weight or less, based on the resin content of the silane-modified polyimide resin composition (A). There is no particular restriction on the method for adding these particles as long as it is done prior to forming the film using the silane-modified polyimide resin composition (A). For example, the addition may be conducted during the polymerization phase of the polyamic acid (1) and/or polyimide (2), the reaction between the polyamic acid (1) and/or polyimide (2) and the epoxy-containing alkoxysilane partial condensate (3), or when the film is formed.

If necessary, depending on uses additives may be added to the silane-modified polyimide resin composition (A) in an amount that does not deteriorate the effects of the present invention. Examples of such additives include organic solvents other than polar solvent, plasticizers, weathering agents, antioxidants, heat stabilizers, lubricants, antistatic agents, whitening agents, coloring agents, electroconductive agents, mold releasing agents, surface modifying agents, viscosity modifiers and coupling agents.

In order to prevent curling of the metal foil laminate, a polyimide having a percentage of imide cyclization 90% or higher can be used as the polyamic acid (1) and/or polyimide (2). This polyimide has a terminal carboxyl and/or acid anhydride groups, and is soluble in the above-mentioned polar solvent (b). The polyimide having a percentage of imide cyclization 90% or higher used for the silane-modified polyimide resin composition (A) of the present invention shrinks little when cured. Accordingly, its use can suitably prevent curling resulting from shrinkage on curing of the metal foil laminate.

Examples of metal foil used for the metal foil laminate include electrolytic copper foils, rolled copper foils, aluminum foils and stainless steel foils. Among these, electrolytic copper foils and rolled copper foils are preferable because of their high electroconductivity, thermal resistance, dynamic strength and other properties. Generally, FPC and TAB use surface-treated copper foils whose adhesion surface has an increased surface roughness to promote adhesion with adhesives. However, a coating film obtained from the silane-modified polyimide resin composition (A) has markedly high adhesion to metal foils without using adhesive. Therefore, such a coating film does not need foils with the above-mentioned surface treatment, and provides sufficient adhesion to untreated copper foils and low-roughness copper foils to allow fine pitching and high frequency circuits. Preferable metal foils are those whose surface roughness (Rz) is not too great. Specifically, Rz of a copper foil used is preferably 7 µm or less, and particularly 3 µm or less. There is no particular restriction on the thickness of the metal foil, but it is preferably 70 µm or thinner, and especially preferably 3–35 µm.

Polyimide-metal laminate I, which is obtained by applying, drying and curing silane-modified polyimide resin composition (A) on one surface of a metal foil, can be produced by known methods as follows:

Examples of methods for applying the resin composition include roll coating, bar coating, lip coating, and screen printing. The amount of composition applied is not particularly limited in these cases, and can be suitably determined depending on the purpose of use of the obtained laminate. Usually, an appropriate amount is such that the cured film is given a thickness ranging from about 3 to about 100 µm, particularly about 5 to about 50 The drying process is preferably conducted at about 80 to about 200° C. for about 3 to about 30 minutes. In this drying process, it is preferable to reduce the volatile content to 50% by weight or less, relative to the cured polyimide film layer. If a volatile matter greater than 50% by weight exists at the curing process, shrinkage and cracks occur in the cured film. Thus, a volatile content greater than 50% by weight is unfavorable. At this stage, the volatile content comprises solvent, alcohol and water.

The temperature and time of the curing process can be suitably determined depending on the percentage of imide cyclization of the polyamic acid (1) and/or polyimide (2) used, and the type of polar solvent used. The curing process is usually conducted at about 150 to about 500° C. for about 1 to about 100 minutes so that the solvent remaining in the coating film is sufficiently removed and the film is cured to a percentage of imide cyclization of almost 100%. This curing causes the conversion of the silane-modified polyimide resin composition into a polyimide-silica hybrid.

Thus, a laminate which consists of two layers, i.e., a polyimide-silica hybrid film layer with a thickness of about 3 to about 100 µm, and a metal foil with a thickness of about 3 to about 70 µm, is obtained.

The above-mentioned laminate has high adhesion strength between the metal foil and the cured polyimide layer (polyimide-silica hybrid film layer). Thus, the laminate has high reliability. However, the coefficient of linear expansion of the cured layer may differ from that of the copper foil, depending on the type of starting materials of alkoxy-containing silane-modified polyimide (a) in the silane-modified polyimide resin composition (A). This may cause curling of the metal foil so that its flatness and smoothness are lost. Such problems can be overcome by the following procedure:

In the preparation of the silane-modified polyimide resin composition (A), an inorganic filler (c) is further added to the alkoxy-containing silane-modified polyimide (a) and polar solvent (b). By doing this, the coefficient of linear expansion (as defined in JIS C7197) of the cured polyimide film that is obtained by applying this composition can be adjusted to be no more than 25 ppm, and preferably 5–20 ppm. The amount of inorganic filler (c) used for this procedure varies depending on the type of starting materials used for the alkoxy-containing silane-modified polyimide (a). Considering the flexibility of the cured film, it is preferable to use the inorganic filler (c) in an amount of 50% by weight or less relative to the cured film.

Also, even if the silane-modified polyimide resin composition (A) can only produce a cured film having a coefficient of linear expansion higher than 25 ppm, the problem of curling can be overcome by making the film thinner, namely 10 µm or thinner.

Another solution to the curling problem is to give the film a three-layer structure of metal foil/polyimide-silica hybrid/polyimide with a low coefficient of linear expansion. This is achieved by further applying a polyimide resin composition (B) comprising a known polyimide and polar solvent (b), with which a polyimide film having a coefficient of linear expansion of 25 ppm or less can be formed, to the silane-modified polyimide resin composition (A) side of the laminate.

There are no particular restrictions on the methods for curing the film in this procedure. For example, it may be conducted by applying the silane-modified polyimide resin composition (A) to the metal foil, drying and curing the composition to form a film, further applying the polyimide resin composition (B) to the film, and then drying and curing the composition. It can also be conducted by applying the silane-modified polyimide resin composition (A) on the metal foil, drying but not curing the composition, subsequently applying the polyimide resin composition (B) on the composition (A), drying the composition (B) and curing both layers simultaneously.

Curling can also be overcome by giving the laminate a three-layer structure of metal foil/polyimide-silica hybrid/polyimide-silica hybrid with a low coefficient of linear expansion by using, in place of the above-mentioned known polyimide resin composition (B), the silane-modified polyimide resin composition (A) comprising the inorganic filler (c) so that its cured film has a coefficient of linear expansion of 25 ppm or less.

When the polyimide resin composition (B) or the silane-modified polyimide resin composition (A) which is adjusted to form a cured film having a coefficient of linear expansion of 25 ppm or less is further used, the amount applied is usually such that the thickness of the resulting cured film ranges from about 1 to about 50 µm, preferably about 3 to about 30 µm.

Examples of the layer constitution of the polyimide-metal laminate I of the present invention include a two-layer structure of metal foil/polyimide-silica hybrid, a three-layer structure of metal foil/polyimide-silica hybrid/polyimide with a low coefficient of linear expansion and a three-layer structure of metal foil/polyimide-silica hybrid/polyimide-silica hybrid with a low coefficient of linear expansion.

The laminates of these layer constitutions can also be further made into double-sided metal laminates by plating the polyimide-silica hybrid or polyimide side. Ie., the above laminates can be further made to have a three-layer structure of metal foil/polyimide-silica hybrid/metal plating, a four-layer structure of metal foil/polyimide-silica hybrid/polyimide with a low coefficient of linear expansion/metal plating, and a four-layer structure of metal foil/polyimide-silica hybrid/polyimide-silica hybrid with a low coefficient of linear expansion/metal plating, respectively.

The method for metal-plating can be a known one such as electroless plating, combination of electroless plating and electroplating, pulse plating, hot dip coating, plasma coating and sputtering, for example. From the standpoint of mass-productivity, electroless plating and the combination of electroless plating and electroplating are especially preferable. Of these, electroless plating deposits a metal used as a catalyst on the surface and inwall of a base material, and then deposits a metal such as copper by electroless plating. The combination of electroless plating and electroplating deposits a thin coating by electroless plating, and then deposits a thicker metal coating by electroplating.

There is no particular restriction on the plating metals used; examples include copper, nickel, gold, silver, platinum, tin, lead, cobalt, tungsten, molybdenum, palladium and their alloys. A metal deposited by electroless plating can be the same as or different from that deposited by electroplating. Preferable metals for electroless plating are copper, nickel and lead. A preferable metal for electroplating is copper.

There is no particular restriction on the thickness of a metal-plating layer. The thickness can be suitably selected depending on the purpose of its use, and is usually within the range from about 1 to about 50 µm, especially about 3 to about 40 µm.

Among the laminates of the present invention, subsequently explained is a polyimide-metal laminate II which is obtained by applying the silane-modified polyimide resin composition (A) to a carrier film, drying, peeling off from the carrier film and curing the composition, and then plating one side or both sides of the cured polyimide film.

As a carrier film, a known one can be used. However, some metal foils such as copper foils, aluminum foils and stainless steel foils are not preferable because their adhesion to the cured polyimide film is too high, and therefore they are difficult to peel off. Teflon films, polyimide films, and polyolefin films are likely to cause unevenness in the thickness of the silane-modified polyimide resin composition applied thereto. For these reasons, it is most preferable to use PET (polyethylene terephthalate) film.

The application amount and method, and the drying conditions of the silane-modified polyimide resin composition (A), when applied and dried on a carrier film, may be the same as in the case where the silane-modified polyimide resin composition (A) is applied to a metal foil as above. The conditions for curing the polyimide resin composition after drying and peeling off from the carrier film may be the same as those for curing the silane-modified polyimide resin composition (A) applied to a metal foil and dried as above. This curing converts the silane-modified polyimide resin composition to a polyimide-silica hybrid.

Subsequently, one or both sides of the above-mentioned polyimide-silica hybrid film are plated. The method for plating, type of plating metal and thickness of the plated layer are the same as in the above case where polyimide-metal laminate I is plated.

By plating one or both sides of the above polyimide-silica hybrid film, a polyimide-metal laminate II of the present invention consisting of a plated layer and a polyimide-silica hybrid is obtained.

The layer constitution of the polyimide-metal laminate II of the present invention is a two-layer structure of metal plating/polyimide-silica hybrid, or a three-layer structure of metal plating/polyimide-silica hybrid/metal plating. The thickness of the metal layers in these laminates is about 1 to about 50 µm, and the thickness of the polyimide-silica hybrid layer is about 3 to about 70 µm.

The above laminate II has high adhesion strength between the metal layer and the polyimide-silica hybrid film, and is thus reliable. However, depending on the types of starting materials for the alkoxy-containing silane-modified polyimide (a) contained in the silane-modified polyimide resin composition (A), the polyimide-silica hybrid film have different coefficients of linear expansion from that of the metal plated layer. This difference may cause peeling during thermal cycles.

To prevent such peeling, in the preparation of the silane-modified polyimide resin composition (A), inorganic filler (c) can be further added to the alkoxy-containing silane-modified polyimide (a) and polar solvent (b). By doing this, the coefficient of linear expansion of the polyimide-silica hybrid film obtained by applying this composition can be adjusted to be no more than 25 ppm, and preferably 5–20 ppm. The amount of inorganic filler (c) used accordingly varies depending on the type of starting materials for the alkoxy-containing silane-modified polyimide (a). Considering the flexibility of the resulting cured film, it is preferable to use inorganic filler (c) in an amount of 50% by weight or less, relative to the cured film.

The polyimide-metal laminate of the present invention can be used to produce circuit boards according to known etching processes.

Polyamideimide-Metal Laminate

The polyamideimide-metal laminate of the present invention has the following two forms:

(1) Polyamideimide-metal laminate I obtained by applying a silane-modified polyamideimide resin composition (C-1) to one side of a metal foil, drying and curing the composition; and (2) Polyamideimide-metal laminate II obtained by applying a silane-modified polyamideimide resin composition (C-2) to one side of a metal foil, drying and curing the composition, and, on the polyamideimide layer of the thus-prepared polyamideimide-metal laminate, then applying another silane-modified polyamideimide resin composition (C-1), and drying and curing the composition.

The silane-modified polyamideimide resin composition (C-1) comprises polar solvent (b), inorganic filler (c), and methoxy-containing silane-modified polyamideimide (d) prepared by reacting polyamideimide (4) having terminal carboxyl and/or acid anhydride groups with a glycidyl ether group-containing methoxysilane partial condensate (5) that is obtainable by demethanolization reaction between glycidol and a methoxysilane partial condensate.

The polyamideimide (4) is a resin which has both amide and imide bonds in each molecule and has terminal carboxyl and/or acid anhydride groups.

The polyamideimide (4) is synthesized either by condensation reaction between a tricarboxylic acid and a diisocyanate; or by allowing a tricarboxylic acid and a diamine to react to introduce an imide bond, and then allowing the product to react with a diisocyanate to induce amidation.

There is no particular restriction on the tricarboxylic acid, which is a constituent of the polyamideimide (4), and known examples can be used. Examples include trimellitic anhydride, butane-1,2,4-tricarboxylic acid, naphthalene-1,2,4-tricarboxylic acid and the like. There is no particular restriction on the diisocyanate either, and known examples can be used. Examples include diphenylmethane-4,4'-diisocyanate, diphenyl ether-4,4'-diisocyanate, tolylene diisocyanate, xylene diisocyanate, isophorone diisocyanate and the like. Examples of diamines include those corresponding to these diisocyanates.

There is no particular restriction on the reaction ratio of the above constituents in the synthesis of the polyamideimide (4) as long as a substantial number of terminal carboxyl and/or acid anhydride groups remain. Isocyanate compounds react with moisture in the air and in solvents. In consideration of this fact, it is preferable that the number of mols of carboxyl and/or acid anhydride groups relative to that of mols of isocyanate groups, or the number of mols of carboxyl and/or acid anhydride groups relative to that of amino groups ranges between 0.95:1 and 1.15:1.

More preferably, the molar ratio of isocyanate or amino groups to carboxyl and/or acid anhydride groups ranges between 1.03:1 and 1.10:1. If the ratio is lower than 1.03:1, the solution tends to become too viscous to handle. If the ratio is higher than 1.10:1, the metal foil laminate tends to become brittle and lack flexibility.

In the production of the polyamideimide (4), dicarboxylic acids and tetracarboxylic acids may be used in addition to tricarboxylic acids. The amount of these acids, if used in addition, is usually 10 mol % or less relative to the tricarboxylic acid. Examples of dicarboxylic acids which can be used in combination with tricarboxylic acid include aliphatic dicarboxylic acids such as oxalic acid, malonic acid, succinic acid, glutaric acid, adipic acid, pimelic acid, suberic acid, sebacic acid, undecandioic acid, dodecandioic acid, tridecandioic acid and anhydrides of these acids; and aromatic dicarboxylic acids such as isophthalic acid, terephthalic acid, diphenylmethane-4,4'-dicarboxylic acid, and anhydrides of these acids, etc. Examples of tetracarboxylic acids which can be used in combination with tricarboxylic acids include diphenylether-3,3',4,4'-tetracarboxylic acid, butane-1,2,3,4-tetracarboxylic acid, benzene-1,2,4,5-tetracarboxylic acid, biphenyl-3,3',4,4'-tetracarboxylic acid, naphthalene-1,2,4,5-tetracarboxylic acid, and acid anhydrides of these acids, etc.

In the preparation of the polyamideimide (4), for example, when a tricarboxylic acid having an acid anhydride group and a carboxyl group and a diisocyanate are used, an imide bond is produced by the reaction between the acid anhydride group and one isocyanate group, and an amide bond is produced by the reaction between the carboxyl group and the other isocyanate group. When a diamine is used instead of a diisocyanate, an amide bond is produced by one amino group and the carboxyl group, and an amic acid (an amide bond and a carboxyl group at the α position) is produced by the condensation of the other amino group and the acid anhydride group. When heated, the amic acid is dehydrated and converted to an imide group. However, amic acids may remain in the methoxy-containing silane-modified polyamideimide (d). In this case, the silane-modified polyamideimide resin composition (C-1) and/or silane-modified polyamideimide resin composition (C-2) are lowered in the storage stability, and tend to make warpage likely in their metal foil laminates. For this reason, the degree of imidization in the polyamideimide (4) is preferably such that the amount of residual amic-acid portions is less than 10 mol %, more preferably less than 5%, relative to the diisocyanate and diamine used.

The glycidyl ether group-containing methoxysilane partial condensate (5) for use in the present invention is obtainable by a demethanolization reaction between a glycidol and a methoxysilane partial condensate.

The methoxysilane partial condensate used is obtained by hydrolyzing the hydrolyzable methoxysilane monomer represented by formula

in the presence of water and an acid or a basic catalyst, and then subjecting the product to partial condensation.

The average number of Si atoms in each molecule of the methoxysilane partial condensate is preferably about 2 to about 100, and more preferably 3 to 8. When the average number of Si atoms is less than 2, the amount of methoxysilanes failing to react with glycidol during the demethanolization reaction and flowing out of the system together with methanol undesirably increases. In contrast, when the number of Si atoms exceeds 100, the reactivity of the methoxysilane partial condensate with glycidol is lowered and the desired product, i.e., glycidyl ether group-containing methoxysilane partial condensate (5), tends to be difficult to obtain.

There is no particular restriction on the ratio of glycidol and methoxysilane partial condensate used. Usually, in the starting materials, the ratio of (the methoxy equivalents of the methoxysilane partial condensate) to (hydroxyl equivalents of glycidol) is preferably about 1:1 to about 100:1. It is preferable to allow demethanolization reaction between the methoxysilane partial condensate and glycidol at this ratio.

When this ratio is high in the above range, the proportion of unreacted methoxysilane partial condensate tends to increase. On the other hand, when the ratio is low in the above range, the thermal resistance of the resulting cured product tends to be lowered by the unreacted glycidol residues. Therefore, the ratio of the above starting materials is more preferably 1.3:1 to 20:1.

The reaction between the methoxysilane partial condensate and glycidol, for example, is a demethanolization reaction that is performed by mixing these materials and heating the mixture while the evolved methanol is removed. The reaction temperature is about 50 to about 150° C., preferably 70 to 110° C. When the demethanolization reaction is performed at a temperature higher than 110° C., the molecular weight of the reaction product may increase excessively as the condensation of methoxysilane proceeds in the reaction system. This may lead to thickening or gelation of the resulting product. In this case, thickening and gelation are prevented by stopping the dealcoholization reaction during the course of reaction or by other manners.

In the demethanolization reaction between the methoxysilane partial condensate and glycidol, known catalysts that do not cause ring opening of oxirane rings may be used to accelerate the reaction. Examples of such catalysts include lithium, sodium, potassium, rubidium, cesium, magnesium, calcium, barium, strontium, zinc, aluminum, titanium, cobalt, germanium, tin, lead, antimony, arsenic, cerium, cadmium, manganese and like metals; and oxides, organic acid salts, halides, alkoxides of these metals, etc. Among them, organotin and tin organoates are particularly preferable. More specifically, dibutyltin dilaurate, tin octoate and the like are effective.

The above reaction can also be performed in a solvent. There is no particular restriction on the solvent as long as it is a polar solvent (b) that can dissolve the methoxysilane partial condensate and glycidol. Preferable examples of such polar solvents include aprotic polar solvents such as N-methyl-2-pyrrolidone, dimethylformamide, dimethylacetamide and the like.

In the thus-obtained glycidyl ether group-containing methoxysilane partial condensate (5), it is preferable that the ratio of (the average number of Si atoms per molecule) to (the average number of glycidyl ether groups per molecule) is from about 1:1 to about 20:1. If this ratio is lower than 1:1, the time for the demethanolization reaction tends to be prolonged. On the other hand, if this ratio is higher than 20:1, the proportion of glycidyl ether groups in the partial condensate (5) is lowered. Accordingly, adhesion at the interface between the silane-modified polyamideimide (d) and inorganic filler (c) is decreased. This leads to reduced dynamic strength and dimensional stability of the metal foil laminate. For these reasons, ratios outside the specified range are unfavorable.

It should be noted that not all the molecules which constitute the glycidyl ether group-containing methoxysilane partial condensate (5) need to have glycidyl ether groups, as long as glycidyl ether groups are contained as a whole in the above-specified ratio. In other words, the partial condensate (5) may contain up to about 20% by weight unreacted methoxysilane partial condensates.

The methoxy-containing silane-modified polyamideimide (d) is obtained by allowing polyamideimide (4) to react with methoxysilane partial condensate (5). This reaction is mainly a ring-opening esterification reaction of the epoxy rings between the carboxyl and/or acid anhydride groups of the polyamideimide (4) and the glycidyl ether groups of the methoxysilane partial condensate (5). In this reaction, methoxy groups themselves in the methoxysilane partial condensate (5) are possibly consumed by water or other substances that are present in the reaction system. However, methoxy groups usually do not participate in the ring-opening esterification reaction. Thus, 60% or more of the methoxy groups usually remain in the silane-modified polyamideimide (d), and preferably 80% or more.

The above silane-modified polyamideimide (d) is prepared, for example, by mixing the polyamideimide (4) and the methoxysilane partial condensate (5) and heating the mixture to cause ring-opening esterification. The reaction temperature is usually about 40 to about 130° C., preferably 70 to 110° C. A reaction temperature of lower than 40° C. prolongs the reaction time, whereas a reaction temperature of higher than 130° C. promotes side reaction, e.g., condensation reactions between methoxy groups. Therefore, reaction temperatures outside the range of 40 to 130° C. are unfavorable. When the reaction temperature is about 40 to about 130° C., the total reaction time is usually about 1 to about 7 hours.

This reaction is usually conducted in the presence of polar solvent (b). There is no particular restriction on the solvent insofar as it is an organic solvent that can dissolve both the polyamideimide (4) and methoxysilane partial condensate (5). Examples of usable polar solvents include N-methyl-2-pyrrolidone, dimethylformamide, dimethylacetamide and the like. In addition to these polar solvents (b) may be added up to 30% by weight of xylene, toluene and like nonpolar solvents, based on the total amount of solvent, so long as the polyamideimide (4) and the methoxysilane partial condensate (5) are not precipitated.

The method for adding the polar solvent (b) to the reaction system is not critical, and may be selected from at least one of the following three methods:

(i) The solvent used in the synthesis of the above polyamideimide (4) from the tricarboxylic acid and diisocyanate or diamine is used as it is.

(ii) The solvent used in the synthesis of the above methoxysilane partial condensate (5) from glycidol and the methoxysilane partial condensate is used as it is.

(iii) The solvent is added before the reaction of the above polyamideimide (4) and the above methoxysilane partial condensate (5).

In the reaction of the polyamideimide (4) and methoxysilane partial condensate (5), a catalyst can be used to accelerate the reaction.

Examples of such catalysts include tertiary amines such as 1,8-diaza-bicyclo[5,4,0]-7-undecene, triethylenediamine, benzyldimethylamine, triethanolamine, dimethylaminoethanol and tris(dimethylaminomethyl)phenol; imidazoles such as 2-methylimidazole, 2-phenylimidazole, 2-phenyl-4-methylimidazole, 2-heptadecylimidazole and benzimidazole; organic phosphines such as tributylphosphine, methyldiphenylphosphine, triphenylphosphine, diphenylphosphine and phenylphosphine; and tetraphenyl boron salts such as tetraphenylphosphonium.tetraphenyl borate, 2-ethyl-4-methylimidazole.tetraphenyl borate, N-methylmorpholine.tetraphenyl borate, etc. These catalysts are preferably used in an amount of about 0.1 to about 5 parts by weight, relative to 100 parts by weight of the polyamideimide (4).

By the above demethanolization reaction, the silane-modified polyamideimide resin composition (C-2) comprising the methoxy-containing silane-modified polyamideimide (d) and polar solvent (b) can be obtained.

This silane-modified polyamideimide (d) has methoxy groups derived from the above methoxysilane partial condensate (5) in it. These methoxy groups undergo sol-gel reaction and dealcoholization condensation reactions by evaporation of solvent, heat treatment or reaction with water (or moisture), forming a mutually bonded cured product. Such a cured product has gelated fine silica portions (higher network structure of siloxane bonds).

The above silane-modified polyamideimide (d) after curing preferably has a silica content in the cured residue of at least 1% by weight but less than 15% by weight. If the silica content is less than 1% by weight, adhesion is lowered. On the other hand, if the content is 15% by weight or more, shrinkage occurs during curing after the application. This causes unfavorable warpage in a laminate of the polyamideimide with a metal foil.

The silane-modified polyamideimide resin composition (C-1) further comprises inorganic filler (c) in addition to the methoxy-containing silane-modified polyamideimide (d) and polar solvent (b). The silane-modified polyamideimide (d) aids the dispersibility of the inorganic filler (c), and improves the dimensional stability of the polyamideimide-silica hybrid film.

The silane-modified polyamideimide resin composition (C-1) or (C-2) of the present invention comprises the silane-modified polyamideimide (d) as an essential resin component. To this resin composition may be added, if desired, suitable amounts of known polyamideimide resins, the above methoxysilane partial condensate, the above glycidyl ether group-containing methoxysilane partial condensate (5) and other resin components unless the objects of the present invention are departed from.

Usually, the above resin composition (C-1) or (C-2) is liquid and has a solids content of about 10 to about 40% by weight. The resin composition may contain, in addition to the polar solvent (b), other organic solvents such as ester-based, ketone-based, alcohol-based, phenol-based solvents, etc.

There is no particular restriction on the amount of the methoxy-containing silane-modified polyamideimide (d) contained in the above resin composition (C-1) or (C-2). Usually, the amount in the cured residue of the composition is 50% or more by weight. Herein, the phrase "cured residue" means the solid content of the above resin composition (C-1) or (C-2) which is left subsequent to the removal of volatile contents after application, sol-gel curing and cyclization to imide ring. For example, the cured residue is the solid which is left after the resin composition is applied in a thickness of 100 μm or less, and dried and cured at 200° C. for 3 hours.

When there is a large difference in the coefficient of linear expansion of the polyamideimide-silica hybrid film layer obtained from the silane-modified polyamideimide resin composition (C-2) and a metal foil in a metal foil laminate, warpage occurs. Therefore, a known inorganic filler (c) is added to the silane-modified polyamideimide resin composition (C-1) so that the coefficient of linear expansion of the film layer approximates that of the metal foil.

Usable as an inorganic filler (c) are oxides such as silica, alumina, titania and magnesium oxide; complex oxides such as kaolin, talc and montmorillonite; carbonates such as calcium carbonate and barium carbonate; sulfates such as calcium sulfate and barium sulfate; titanates such as barium titanate and potassium titanate; and phosphates such as tricalcium phosphate, dicalcium phosphate, monocalcium phosphate, etc. However, it is not restricted to these examples. Among these inorganic fillers (c), silica is the most preferable considering the stability of the silane-modified polyamideimide resin composition (C-1), the dispersibility of the inorganic filler, and its effects in preventing curling.

Usually, it is preferable that the inorganic filler (c) has an average particle diameter from about 0.01 μm to about 5 μm. An inorganic filler (c) having an average particle diameter of less than 0.01 μm is expensive and inappropriate for normal purposes, while those having an average particle diameter of more than 5 μm do not provide sufficient dispersibility and tend to precipitate. There is no particular restriction on the amount of inorganic filler (c) used since its dispersibility in the silane-modified polyamideimide resin composition (C-1) is good. Preferably, it is adjusted so that the coefficient of linear expansion of the polyamideimide-silica hybrid film is similar to that of the metal foil, i.e., about 15 to about 30 ppm.

There is no particular restriction on the timing for adding the inorganic filler (c) as long as it is before any film is formed using the silane-modified polyamideimide resin composition (C-1). For example, it may be added during the polymerization reaction that produces the polyamideimide (4), during the reaction between the polyamideimide (4) and glycidyl ether group-containing methoxysilane partial condensate (5), or immediately before the application of the composition.

Even if the silane-modified polyamideimide resin composition (C-1) forms a polyamideimide-silica film having a coefficient of linear expansion higher than 30 ppm, the film can be prevented from warping by making the film thin, specifically, 10 μm or thinner.

The above silane-modified polyamideimide resin composition (C-1) or (C-2) may also contain additives, depending on its intended use. Usable additives include plasticizers, weathering agents, antioxidants, heat stabilizers, lubricants, antistatic agents, whitening agents, coloring agents, electroconductive agents, mold releasing agents, surface modifying agents, viscosity modifiers, coupling agents, etc. These additives may be used within a range that does not deteriorate the effects of the present invention.

The desired metal foil laminate can be formed by applying the silane-modified polyamideimide resin composition (C-2) and/or (C-1) to a metal foil, drying, heating and curing the composition. The polyamideimide-silica hybrid film in the metal foil laminate has silica ($SiO_2$) portions formed by the methoxy-containing silane-modified polyamideimide (d) and the inorganic filler (c).

The polyamideimide-silica hybrid film obtained from the silane-modified polyamideimide resin composition (C-1) or (C-2) has a low percentage of water absorption and is highly electrically insulative because of the effect of silica formation. However, when the metal foil laminate is used especially for FPC, TAB, COF and the like, it is preferable to adjust the dielectric constant at 1 kHz to about 3.5 or less, and the percentage of water absorption to less than 3% by weight. If the dielectric constant is higher than 3.5, the thickness of the polyamideimide-silica hybrid film must be increased to obtain sufficient insulation, but this thickness is too thick. A percentage of water absorption higher than 3% by weight may unfavorably deteriorate the dimensional stability and cause warpage of the metal foil laminate.

The metal foil for use in the polyamideimide-metal laminate of the present invention may be any of those used for the above polyimide-laminate.

Of the polyamideimide-metal laminates of the present invention, polyamideimide-metal laminate I, which is obtainable by applying the silane-modified polyamideimide resin composition (C-1) to one side of a metal foil, and drying and curing the composition, can be usually prepared in the following manner:

The polyamideimide-metal laminate I is obtained by applying the silane-modified polyamideimide resin composition (C-1) to a metal foil, and drying and curing the composition by known methods. The application method and amount applied are the same as in the case of the above polyimide-metal laminate.

The drying process is preferably performed at about 80 to about 200° C. for about 3 to about 30 minutes. In this drying process, it is preferable to reduce the volatile content to 50% by weight or less, relative to the cured polyamideimide film layer. If a volatile content exceeding 50% by weight is present during the curing process, unfavorable shrinkage and cracking occur in the resulting cured film. At this time, solvents, alcohols and water are evolved as volatile contents.

The temperature and time for the curing process are suitably determined according to the amount of methanol generated by the sol-gel reaction of the methoxy-containing silane-modified polyamideimide (d) used; the kind of solvent; and the thickness of the polyamideimide-silica hybrid film. The curing process is performed at about 200 to about 350° C., preferably at about 200 to about 300° C., for about 1 to about 40 minutes. In this manner, the solvent remaining in the coating film is sufficiently removed, the sol-gel reaction is completed and the film is cured.

The adhesion strength of the metal foil laminate (metal foil/cured film) obtained by applying the silane-modified polyamideimide resin composition (C-1) additionally containing inorganic filler (c) to a metal foil, drying and curing the composition, may be lowered depending on the type and amount of the inorganic filler (c) in the silane-modified polyamideimide resin composition (C-1).

In this case, sufficient adhesion to a metal foil can be obtained by preparing the polyamideimide-metal laminate II in the following manner: the silane-modified polyamideimide resin composition (C-2), which contains the methoxy-containing silane-modified polyamideimide (d) and polar solvent (b), but does not contain inorganic filler (c), is applied to a metal foil; the resin composition is then dried and cured to form a polyamideimide-silica hybrid film that has a high coefficient of linear expansion and excellent adhesion to the metal foil; then the silane-modified polyamideimide resin composition (C-1), which further contains inorganic filler (c) and can form a film with a low coefficient of linear expansion, is applied to the cured film; and then the applied resin composition is dried and cured. At this time, to prevent warpage of the metal foil laminate, the thickness of the polyamideimide-silica hybrid film formed from the silane-modified polyamideimide resin composition (C-2) is preferably 10 μm or less.

The application, drying and curing of the silane-modified polyamideimide resin composition (C-2) can be performed in a similar manner to silane-modified polyamideimide resin composition (C-1).

Thus obtained is a laminate of the present invention having a polyamideimide-silica hybrid film-based two-layer structure of metal foil/composition (C-1), or a polyamideimidepolyamideimide-silica hybrid film-based three-layer structure of metal foil/composition (C-2)/composition (C-1). In these laminates, the thickness of each polyamideimide layer based on composition (C-1) or (C-2) can be suitably determined according to the use of the final product. When the laminate is used for FPC, TAB, and/or COF, it is preferable that the polyamideimide-silica hybrid film layer as a whole has a thickness of about 3 to about 100 μm, and especially preferably 5 to 50 μm.

The above polyamideimide-metal laminate of the present invention can also be produced as a double-metal-sided laminate, if necessary. This is achieved by further plating the polyamideimide-silica hybrid film side of the laminate, as in the case of the polyimide-metal laminate described above.

The polyamideimide-metal laminate of the present invention can be used for producing circuit boards by known etching processes.

BEST MODE FOR CARRYING OUT THE INVENTION

Hereinafter, the present invention will be described in more detail with reference to preparative examples, examples and comparative examples.

Embodiments of Polyimide-Metal Laminate

Preparative Example 1

Preparation of Epoxy-Containing Alkoxysilane Partial Condensate (3)

A reactor equipped with a stirrer, a condenser, a thermometer and a nitrogen inlet was charged with 1,400 g of glycidol (manufactured by NOF CORPORATION, trade name "Epiol OH") and 8,957.9 g of tetramethoxysilane partial condensate (manufactured by Tama Chemicals Co., Ltd., trade name "Methyl Silicate 51", average number of Si atoms: 4). The mixture was heated to 90° C. while stirring under a stream of nitrogen. Thereafter, 2.0 g of dibutyltin dilaurate was added as a catalyst, and the resultant was allowed to react. During the reaction, evolved methanol was distilled off by using the condenser. When the distillate amounted to 630 g, the reaction product was cooled. The period from completion of heating to cooling of the reaction product was 5 hours. Subsequently, about 80 g of methanol remaining in the system was removed under reduced pressure (13 kPa) over 10 minutes. Thus, epoxy-containing alkoxysilane partial condensate (3-1) with an epoxy equivalent of 512 g/eq was obtained.

The ratio of hydroxyl equivalents of glycidol to methoxy equivalents of tetaramethoxysilane partial condensate in the starting materials was 0.10:1.

Preparative Example 2

Preparation of an epoxy-containing alkoxysilane partial condensate (3)

The same reactor used in Preparative Example 1 was charged with 1,400 g of glycidol and 9,142.1 g of methyltrimethoxysilane partial condensate (manufactured by Tama Chemicals Co., Ltd., "MTMS-B", average number of Si atoms: 6). The mixture was heated to 90° C. with stirring under a stream of nitrogen. Subsequently, 2.0 g of dibutyltin dilaurate was added to the mixture as a catalyst, and the mixture was then allowed to react. During the reaction, evolved methanol was distilled off by using the condenser. When the distillate amounted to 640 g, the reaction product was cooled. The period from completion of heating to cooling of the reaction product was 6.5 hours. Subsequently, about 32 g of methanol remaining in the system was removed under reduced pressure (13 kPa) over about 10 minutes. Thus, epoxy-containing alkoxysilane partial condensate (3-2) with epoxy equivalent of 832 g/eq was obtained.

The ratio of hydroxyl equivalents of glycidol to methoxy equivalents of methyltrimethoxysilane partial condensate in the starting materials is 0.068:1.

Preparative Example 3

Preparation of Silane-Modified Polyimide Resin Composition (A)

A 2-liter four-necked flask equipped with a stirrer, condenser, a thermometer and a nitrogen inlet was charged with N-methylpyrrolidone. Subsequently, 4,4'-diaminodiphenyl ether and pyromellitic acid were added while cooling to 40° C. or below, so that the molar ratio of tetracarboxylic acid to diamine was 0.99:1. The resultant was allowed to react at 40° C. for one hour, giving a polyamic acid solution. Thereafter, the obtained solution was heated to 90° C. over one hour for dehydrative cyclization, giving a polyimide (2-1). IR analysis showed that the percentage of imide cyclization was 25%.

The polyimide (2-1) solution was heated to 80° C., and epoxy-containing alkoxysilane partial condensate (3-1) was added to the heated solution so that the ratio of (the epoxy equivalents of the epoxy-containing alkoxysilane partial condensate (3)) to (the carboxylic acid equivalents of the tetracarboxylic acids used for the polyamic acid (1) and/or polyimide (2)) was 0.07:1, and the resultant was allowed to react at 80° C. for 16 hours. The reaction product was cooled to room temperature, giving alkoxy-containing silane-modified polyimide solution with 17% by weight cured residue, which was employed as silane-modified polyimide resin composition (A-1).

Preparative Example 4

Preparation of Silane-Modified Polyimide Resin Composition (A)

The polyimide (2-1) solution prepared in Preparative Example 3 was heated to 80° C., and epoxy-containing alkoxysilane partial condensate (3-2) was then added thereto so that the ratio of (the epoxy equivalents of the epoxy-containing alkoxysilane partial condensate (3)) to (the carboxylic acid equivalents of the tetracarboxylic acids used for the polyamic acid (1) and/or polyimide (2)) was 0.10:1, and the resultant was allowed to react at 80° C. for 14 hours. The reaction product was cooled to room temperature, giving alkoxy-containing silane-modified polyimide solution with 17% by weight cured residue, which was employed as silane-modified polyimide resin composition (A-2).

Preparative Example 5

Preparation of Silane-Modified Polyimide Resin Composition (A)

A reactor equipped with a stirrer and a nitrogen inlet was charged with N-methyl-2-pyrrolidone, and p-phenylenediamine and 3,3',4,4'-biphenyl tetracarboxylic dianhydride were added thereto so that the molar ratio thereof was 0.99:1. The mixture was then allowed to react at 30° C. for one hour, giving a polyamic acid (1-1). IR analysis showed that the percentage of imide cyclization was 0%.

The polyamic acid (1-1) solution was heated to 80° C., and epoxy-containing alkoxysilane partial condensate (3-1) was then added to the heated solution so that the ratio of (the epoxy equivalents of the epoxy-containing alkoxysilane partial condensate (3)) to (the carboxylic acid equivalents of the tetracarboxylic acids used for the polyamic acid (1) and/or polyimide (2)) was 0.07:1. The resultant was then allowed to react at 80° C. for 16 hours. The reaction product was cooled to room temperature, giving alkoxy-containing silane-modified polyimide solution with 17% by weight cured residue, which was employed as silane-modified polyimide resin composition (A-3).

Preparative Example 6

Preparation of Silane-Modified Polyimide Resin Composition (A)

To the silane-modified polyimide resin composition (A-1) prepared in Preparative Example 3 was mixed 30% weight silica filler (trade name "fine seal T-32", manufactured by Tokuyama, average particle diameter of 1.5 μm) relative to the weight of the cured residue of the silane-modified polyimide resin composition (A-1) solution. The mixture was sufficiently stirred with a mixer, giving a silane-modified polyimide resin composition (A-4).

Preparative Example 7

Preparation of Silane-Modified Polyimide Resin Composition (A)

A reactor equipped with a stirrer, a condenser, a thermometer and a nitrogen inlet was charged with 43.20 g of diphenyl sulfone-3,3',4,4'-tetracarboxylic dianhydride, 45.00 g of 2,2-bis[4-(4-aminophenoxy)phenyl] propane, 248.82 g of N-methyl-pyrrolidone and 62.20 g of xylene. The mixture was subjected to dehydrative cyclization at 170° C. for 4 hours while removing the evolved water with the condenser. Thus, a polyimide (2-2) solution that is soluble in organic solvents was obtained. The molar ratio of (tetracarboxylic dianhydride) to (diamine) of polyimide (2-2) was 1.10:1. NMR and IR analysis showed that the percentage of imide cyclization of the polyimide (2-2) was 100%.

The obtained polyimide (2-2) solution was heated to 90° C., and 7.21 g of the epoxy-containing alkoxysilane partial condensate (3-1) was added and then allowed to react at 90° C. for 8 hours. Subsequently, the resultant product was cooled to room temperature, giving alkoxy-containing silane-modified polyimide resin solution with 26% by weight cured residue, which was employed as silane-modified polyimide resin composition (A-5).

The ratio of (the epoxy equivalents of the epoxy-containing alkoxysilane partial condensate (3)) to (the carboxilic acid equivalents of the tetracarboxylic acids used for the polyamic acid (1) and/or polyimide (2)) was 0.028:1.

Preparative Example 8

Preparation of Silane-Modified Polyimide Resin Composition (A)

A reactor equipped with a stirrer, a condenser, a thermometer and a nitrogen inlet was charged with 24.88 g of 3,3',4,4'-biphenyl tetracarboxylic dianhydride, 35.00 g of bis[4-(3-aminophenoxy)phenyl]sulfone, 180.43 g of N-methylpyrrolidone and 45.11 g of xylene. The mixture was subjected to dehydrative cyclization at 170° C. for 4 hours while recovering the evolved water with the condenser. Thus, a polyimide (2-3) solution that is soluble in organic solvents was obtained. The molar ratio of (tetracarboxylic dianhydride) to (diamine) of polyimide (2-3) was 1.04:1. NMR and IR analysis showed that the percentage of imide cyclization of polyimide (2-3) was 100%.

The obtained polyimide (2-3) solution was heated to 90° C., and 2.44 g of the epoxy-containing alkoxysilane partial condensate (3-1) was added thereto, and the mixture was then allowed to react at 90° C. for 8 hours. Subsequently, the resultant product was cooled to room temperature, giving alkoxy-containing silane-modified polyimide resin solution with 25% by weight cured residue.

The ratio of (the epoxy equivalents of the epoxy-containing alkoxysilane partial condensate (3)) to (the carboxylic acid equivalents of the tetracarboxylic acids used for polyamic acid (1) and/or polyimide (2)) was 0.028:1.

To the alkoxy-containing silane-modified polyimide resin solution thus prepared was mixed 30% weight silica filler (trade name "Fineseal T-32", manufactured by Tokuyama, average particle diameter of 1.5 μm) relative to the weight of the cured residue of the polyimide resin composition solution. The mixture was sufficiently stirred with a mixer, giving a silane-modified polyimide resin composition (A-6).

Comparative Preparative Example 1

A polyimide varnish (trade name "Pyre-ML", manufactured by I.S.T CORPORATION, N-methylpyrrolidone solution of a polyimide derived from pyromellitic anhydride and 4,4'-diaminodiphenyl ether, 15% by weight polyimide cured residue) was employed as is as the polyimide resin composition (H-1).

Comparative Preparative Example 2

The polyamic acid (1-1) solution obtained in Preparative Example 5 was used as the polyimide resin composition (H-2).

Measurement of Coefficient of Linear Expansion of Polyimide Resin Composition

The silane-modified polyimide resin compositions (A-1) to (A-6) obtained in Preparative Examples 3–8 and the polyimide resin compositions (H-1) and (H-2) obtained in Comparative Preparative Examples 1 and 2 were applied to separate tin plates using a #75 bar coater. The applied resin compositions were dried at 120° C. for 20 minutes, and then peeled off from the tin plates. These peeled-off resin compositions were cured at 250° C. for 20 minutes, producing polyimide-silica hybrid films and polyimide films having a thickness of 25 μm.

The coefficients of linear expansion of these films were measured at 40–200° C. using a thermal stress distortion measuring apparatus (trade name "TMA120C" manufactured by Seiko Instruments & Electronics Ltd.). The results are shown in Table 1.

TABLE 1

| (Silane-modified) Polyimide resin composition | Coefficient of linear expansion (ppm) |
|---|---|
| (A-1) | 32 |
| (A-2) | 34 |
| (A-3) | 20 |
| (A-4) | 18 |
| (A-5) | 50 |
| (A-6) | 20 |
| (H-1) | 36 |
| (H-2) | 23 |

Example 1

To an electrolytic copper foil (trade name "FO-WS", manufactured by THE FURUKAWA ELECTRIC CO., LTD., thickness: 18 μm, surface roughness: Rz=1.5) was applied the silane-modified polyimide resin composition (A-1), using a #75 bar coater. The applied resin composition was dried at 120° C. for 20 minutes and then cured at 360° C. for 10 minutes, giving a polyimide-metal foil laminate with a polyimide film thickness of 25 μm.

Examples 2–4 and Comparative Examples 1 and 2

A polyimide-metal foil laminate with a polyimide film thickness of 25 μm was prepared in a similar manner to Example 1 except that each of silane-modified polyimide resin compositions (A-2)-(A-4) and polyimide resin compositions (H-1)–(H-2) was used in place of the silane-modified polyimide resin composition (A-1).

Example 5

A polyimide-metal foil laminate with a polyimide film thickness of 5 μm was prepared in a similar manner to Example 1.

Examples 6–7

To an electrolytic copper foil (trade name "FO-WS", manufactured by THE FURUKAWA ELECTRIC CO., LTD., thickness: 18 μm, surface roughness: Rz=1.5) was applied each of the silane-modified polyimide resin compositions (A-5) and (A-6), using a #75 bar coater. The applied resin compositions were dried at 120° C. for 30 minutes and then cured at 250° C. for 1 hour, giving polyimide-metal foil laminates of Example 6 and 7 having a polyimide film thickness of 25 μm.

Example 8

A metal foil laminate having a polyimide film thickness of 6 μm was produced in a similar manner to Example 1: the silane-modified polyimide resin composition (A-1) was applied to an electrolytic copper foil using a #20 bar coater; and the applied resin composition was dried at 120° C. for 20 minutes. The polyimide resin composition (H-2) was applied to the polyimide resin side of the laminate using a #60 bar coater. The applied resin composition was dried at 120° C. for 20 minutes, and then cured at 360° C. for 10 minutes, giving a polyimide-metal foil laminate whose total thickness of the two polyimide layers of 26 μm.

Example 9

A metal foil laminate having a polyimide film thickness of 6 μm was produced in a similar manner to Example 1: the silane-modified polyimide resin composition (A-1) was applied to an electrolytic copper foil using a #20 bar coater; and the applied resin composition was dried at 120° C. for 20 minutes. To the polyimide resin side of the laminate was applied the silane-modified polyimide resin composition (A-4), using a #60 bar coater. The applied resin composition was dried at 120° C. for 20 minutes, then cured at 360° C. for 10 minutes, giving a polyimide-metal laminate whose total thickness of the two polyimide layers is 25 μm.

Comparative Example 3

A metal foil laminate having a polyimide film thickness of 6 μm was produced in a similar manner to Example 1: the polyimide resin composition (H-1) was applied to an electrolytic copper foil using a #75 bar coater; and the applied resin composition was dried at 120° C. for 20 minutes. To the polyimide resin side of the laminate was applied the silane-modified polyimide resin composition (A-4), using a #75 bar coater. The applied resin composition was dried at 120° C. for 20 minutes, and then cured at 360° C. for 10 minutes, giving a polyimide-metal laminate whose total thickness of the two polyimide layers is 26 μm.

Performance Test of Polyimide-Metal Foil Laminates

Performance tests were conducted on the adhesion, smoothness, resistance to soldering heat and stability of adhesion to heat of the polyimide-metal foil laminates produced in Examples 1–9 and Comparative Examples 1–3.

The test methods are as follows:

Adhesion: The polyimide-metal foil laminates were subjected to a cross-cut peel test using a cellophane adhesive tape according to the method described in JIS K 5400. According to the number of squares remaining on the film, the adhesion was evaluated on the following scale:

A: 100 squares out of 100 remaining; B: 99–90 squares out of 100 remaining; C: 89–50 squares out of 100 remaining; and D: 49–0 squares out of 100 remaining.

Smoothness: The smoothness of the polyimide-metal foil laminates was inspected visually and evaluated on the following scale:

A: No warpage was found; B: warpage was found; and C: curling was found.

Resistance to soldering heat: The polyimide-metal foil laminates were immersed in a 300° C. solder bath for 10 minutes. The laminates were then observed for the presence or absence of foaming and evaluated for their resistance to soldering heat on the following scale:

A: No foaming was found, i.e., heat-resistance is good; B: Foaming was found in part; and C: Foaming was found throughout the surface.

Stability of adhesion to heat: The polyimide-metal foil laminates were immersed in a 300° C. solder bath for 10 minutes, taken out and then left to cool for 10 minutes. This cycle was repeated 10 times. Adhesion was then inspected visually and evaluated on the following scale:

A: There was no change in appearance and adhesion remained unchanged after immersion in the solder bath; B: blistering occurred and adhesion was lowered; and C: the polyimide layer was exfoliated during immersion in the solder bath.

The results of the performance tests are shown in Table 2.

TABLE 2

| Metal foil laminate | Polyimide resin composition | Adhesion | Smoothness | Resistance to soldering heat | Stability of adhesion to heat |
|---|---|---|---|---|---|
| Ex. 1 | (A-1) | A | C | A | B |
| Ex. 2 | (A-2) | A | B | A | A |
| Ex. 3 | (A-3) | A | A | A | A |
| Ex. 4 | (A-4) | B | A | A | B |
| Ex. 5 | (A-1) | A | A | A | A |
| Ex. 6 | (A-5) | A | A | A | A |
| Ex. 7 | (A-6) | A | A | A | A |
| Ex. 8 | (A-1)→(H-2) | A | A | A | A |
| Ex. 9 | (A-1)→(A-4) | A | A | A | A |
| Comp. Ex. 1 | (H-1) | D | C | A | C |
| Comp. Ex. 2 | (H-2) | C | A | A | C |
| Comp. Ex. 3 | (H-1)→(A-4) | D | B | A | C |

In this table, in the row of the polyimide resin composition of Example 8, (A-1)→(H-2) denotes that the silane-modified polyimide resin composition (A-1) was applied and then the polyimide resin composition (H-2) was further applied thereon. This also applies to Example 9 and Comparative Example 3.

Examples 10–14 and Comparative Examples 4–5

Electroless copper plating was applied to both sides of each of the single metal-sided metal foil laminates of Examples 1, 3, 4, 7 and 9 and Comparative Examples 1 and 2, producing thin copper platings having a thickness of 0.3 μm. Subsequently, the copper plate of the polyimide layer side of these laminates was further electroplated to produce a copper layer having a thickness of 30 μm, giving double-metal-sided laminates of Examples 9–13 and Comparative Examples 4–5.

The adhesion of the copper electroplated layer of the obtained double-metal-sided metal laminates was tested by measuring their peel strength according to JIS C 6481. The adhesion test results are shown in Table 3.

TABLE 3

| Single metal-sided metal foil laminate | Double-metal-sided laminate | Peel strength (kg/cm) |
|---|---|---|
| Ex. 1 | Ex. 10 | 1.5 |
| Ex. 3 | Ex. 11 | 0.8 |
| Ex. 4 | Ex. 12 | 1.6 |
| Ex. 7 | Ex. 13 | 1.0 |
| Ex. 9 | Ex. 14 | 1.4 |
| Comp. Ex. 1 | Comp. Ex. 4 | <0.2 |
| Comp. Ex. 2 | Comp. Ex. 5 | <0.2 |

Example 15

To an electrolytic copper foil (trade name "FO-WS", manufactured by THE FURUKAWA ELECTRIC CO., LTD., thickness: 18 μm, surface roughness: Rz=1.5) was applied the silane-modified polyimide resin composition (A-1), using a #36 bar coater. The applied resin composition was dried at 120° C. for 20 minutes and then cured at 360° C. for 10 minutes, giving a polyimide-metal foil laminate having a polyimide film thickness of about 15 μm.

Examples 16, 17, Comparative Examples 6 and 7

Polyimide-copper foil laminates having a polyimide film thickness of about 15 μm were produced in a similar manner to Example 15 except that silane-modified polyimide resin compositions (A-2), (A-3), and polyimide resin compositions (H-1) and (H-2) were used in place of the silane-modified polyimide resin composition (A-1), respectively.

Performance Test of Polyimide-Metal Foil Laminates

The migration of copper ions to the polyimide layer of the copper foil laminates of Examples 15–17 and Comparative Examples 6 and 7 was examined in the following manner:

Migration of copper ions: The copper foil laminates were left to stand for three days at room temperature and at 95% relative humidity. Then, the polyimide side of the copper foil laminates was subjected to argon ion etching for 5 minutes at a voltage of 0.6 keV and at 50 mA current. The etched polyimide side was subjected to surface analysis using an X-ray photoelectron spectrometer (trade name "ESCA-3200", manufactured by Shimadzu Corporation). The surface analysis was performed at a voltage of 10 kV, with 30 mA current and 3 scans. This cycle of surface etching/surface analysis was repeated until copper atoms (zero valent) derived from the copper foil appeared. In the copper foil laminates of Examples and Comparative Examples, the polyimide layer disappeared and copper atoms derived from the copper foil appeared after etching 200–250 minutes in total. The concentration of copper ions (divalent) relative to carbon atoms in the polyimide layer was determined at a 2-μm depth from the interface of the copper foil and the polyimide layer. Based on this concentration, the degree of migration was evaluated. The test results are shown in Table 4.

TABLE 4

| Laminate | Copper ions/carbon atoms (% by weight) |
|---|---|
| Ex. 15 | 1.3 |
| Ex. 16 | 1.4 |
| Ex. 17 | 1.9 |
| Comp. Ex. 6 | 8.5 |
| Comp. Ex. 7 | 9.6 |

As seen from Table 4, substantial amounts of copper ions were detected from the copper foil laminates of Comparative Examples 6 and 7. These results confirm the migration of copper ions. In contrast, in Examples 15–17, the copper ion concentrations were relatively low, compared to those of Comparative Examples 6 and 7. This indicates superior migration resistance of the laminates of Examples 15–17.

Examples 18–21, Comparative Examples 8 and 9

The silane-modified polyimide resin compositions (A-1)–(A-4) and polyimide resin compositions (H-1) and (H-2) were applied to a PET film (trade name "50-T-60", manufactured by Toray Industries, Inc.) using a lip coater. The applied resin compositions were dried at 120° C. for 20 minutes, then peeled off from the PET films, and cured at 250° C. for 20 minutes, giving polyimide-silica hybrid films and polyimide films having a thickness of 25 μm.

The thus-obtained films were processed with a palladium catalyst solution, and then plated with electroless copper, forming a copper plated layer having a thickness of 0.5 μm. One side of each laminate obtained was then electroplated with copper, forming a copper plated layer having a thickness of 20 μm. Thus obtained were the laminates of Examples 18–21, which consist of a copper plated layer/a polyimide-silica hybrid film layer, and the laminates of Comparative Examples 8–9, which consist of a copper plated layer/a polyimide film layer.

Performance Test of Polyimide-Metal Laminates

The polyimide-metal laminates obtained in Examples 18–21 and Comparative Examples 8 and 9 were tested for their plating adhesion, smoothness and resistance to soldering heat in the following manner:

Plating adhesion: The peel strength of the copper plated layers of the polyimide-metal laminates was measured 3 times each at a 90° angle, and the mean value was determined.

Smoothness: The smoothness of the polyimide-metal laminates were inspected visually and evaluated on the following scale:

A: No warpage was found; and B: warpage was found.

Resistance to soldering heat: The polyimide-metal laminates were immersed in a 300° C. solder bath for 10 minutes, and then was left at room temperature. This cycle was repeated 10 times. The presence or absence of exfoliation was then evaluated on the following scale:

A: No foaming or peeling off was found; B: peeling was found in part; and C: peeling was found.

The test results are shown in Table 5.

TABLE 5

| Laminate | Plating adhesion (kg/cm) | Smoothness | Resistance to soldering heat |
|---|---|---|---|
| Ex. 18 | 1.2 | A | A |
| Ex. 19 | 0.7 | A | B |
| Ex. 20 | 1.3 | A | A |
| Ex. 21 | >1.5 | A | A |
| Comp. Ex. 8 | <0.2 | B | C |
| Comp. Ex. 9 | <0.2 | A | C |

Embodiments of Polyamideimide-Metal Laminate

Preparative Example 9

Preparation of Polyamideimide (4)

A reactor equipped with a stirrer, condenser and thermometer was charged with 1,160 g of N-methyl-2-pyrrolidone (hereinafter referred to as "NMP"), 290 g of xylene, 346 g of trimellitic anhydride and 433 g of 4,4'-diphenylmethanediisocyanate. The mixture was reacted at 90° C. for 2 hours in a stream of nitrogen. The nitrogen stream was then stopped, and the mixture was heated to 135° C. over 1 hour. The reaction was continued for 3.5 hours, and then the mixture was cooled and diluted with a mixed solvent of NMP/xylene (4/1 by weight), giving a solution of polyamideimide (4-1) having a nonvolatile content of 25% by weight. The weight average molecular weight (referenced to styrene by GPC) of this polyamideimide resin was 12,500.

Preparative Example 10

Preparation of Polyamideimide (4)

The same reactor as in Preparative Example 9 was charged with 1,140 g of NMP, 285 g of xylene, 346 g of trimellitic anhydride and 417 g of 4,4'-diphenylmethanediisocyanate. The mixture was allowed to react at 90° C. for 2 hours in a stream of nitrogen. The nitrogen stream was then stopped, and the mixture was heated to 135° C. over 1 hour. The reaction was continued for 15 hours, and then the mixture was cooled and diluted with a mixed solvent of NMP/xylene (4/1 by weight), giving a solution of polyamideimide (4-2) having a nonvolatile content of 25% by weight. The weight average molecular weight (referenced to styrene by GPC) of this polyamideimide resin was 6,400.

Preparative Example 11

Preparation of Glycidyl Ether Group-Containing Methoxysilane Partial Condensate (5)

The same reactor used in Preparative Example 9 was charged with 250 g of glycidol (manufactured by NOF CORPORATION, trade name "Epiol OH") and 800 g of tetramethoxysilane partial condensate (manufactured by Tama Chemicals Co., Ltd., trade name "Methyl silicate 51", average number of Si atoms: 4). The mixture was heated to 90° C. with stirring in a stream of nitrogen. Then, 1.00 g of dibutyltin dilaurate was added to the reactor as a catalyst to cause demethanolization. During the reaction, methanol was removed from the reaction system using the condenser. When the removed methanol amounted to about 90 g, the mixture was cooled. The period from the completion of heating of the mixture to the initiation of cooling was 6 hours. After the mixture had cooled to 50° C., the nitrogen inlet line and the condenser were removed from the reactor. A vacuum line was connected to the flask to remove methanol remaining in the system for about 15 minutes at 13 kPa. About 21 g of methanol was removed under reduced pressure over these 15 minutes. Thereafter, the flask was cooled to room temperature, yielding 930 g of a glycidyl ether group-containing methoxysilane partial condensate (5-1).

The (methoxy equivalents of the tetramethoxysilane partial condensate) to (hydroxyl equivalents of glycidol) in the starting materials was 5:1, and (the average number of Si atoms per molecule of the condensate (5-1)) to (the average number of glycidyl ether groups per molecule of the condensate (5-1)) was 2:1.

Preparative Example 12

Preparation of Silane-Modified Polyamideimide Resin Composition

The same reactor used in Preparative Example 9 was charged with 200 g of the polyamideimide resin solution (4-1) obtained in Preparative Example 9 and 1.15 g of the glycidyl ether group-containing alkoxysilane partial condensate (5-1) obtained in Preparative Example 11. The mixture was heated to 95° C., and allowed to react for a further 4 hours. Then, 1.83 g of NMP was added, and the mixture was cooled, giving a silane-modified polyamideimide resin solution having a nonvolatile content of 25% by weight. To 200 g of this silane-modified polyamideimide resin solution was further admixed 29.8 g of a silica filler (trade name "Fineseal T-32", manufactured by TOKUYAMA CORP., average particle diameter: 1.5 μm) and 89.5 g of NMP, giving a silane-modified polyamideimide resin composition having a nonvolatile content of 25% by weight and a silica content of 38% by weight in the cured residue.

Preparative Examples 13–17

Preparation of Silane-Modified Polyamideimide Resin Composition

A silane-modified polyamideimide resin composition was prepared in a similar manner to Preparative Example 12, except that the amounts of the solution of polyamideimide (4-1), glycidyl ether group-containing alkoxysilane partial condensate (5-1), NMP and silica filler used were changed as shown in Table 6. The resulting resin compositions all had a nonvolatile content of 25% by weight and a silica content of 38% by weight in the cured residue.

Preparative Example 18

The solution of polyamideimide (4-2) obtained in Preparative Example 10 was used as it was as a comparative resin composition.

Preparative Example 19

Preparation of Silane-Modified Polyamideimide Resin Composition

A silane-modified polyamideimide resin composition was prepared in a similar manner to Preparative Example 15 except that the silica filler was not used. The resulting resin composition had a silica content of 38% by weight in the cured residue.

Preparative Example 20

To 200 g of the solution of polyamideimide (4-2) prepared in Preparative Example 10 was admixed 30.7 g of a silica filler (trade name "Fineseal T-32", manufactured by TOKUYAMA CORP., average particle diameter: 1.5 μm) and 91.9 g of NMP, giving a comparative polyamideimide resin composition having a nonvolatile content of 25% by weight. This polyamideimide resin composition formed a precipitate when left to stand because of the poor dispersibility of the silica filler contained therein. Therefore, the composition could not be used for subsequent tests.

The constitutions of the resin compositions of Preparative Examples 12–20 are shown in Table 6.

TABLE 6

| Prep. Ex. | 12 | 13 | 14 | 15 | 16 | 17 | 18 | 19 | 20 |
|---|---|---|---|---|---|---|---|---|---|
| PAI (4-1) Solution | 200 | 200 | | | | | | | |
| (4-2) | | | 200 | 200 | 200 | 200 | 200 | 200 | 200 |
| Condensate (5-1) | 1.15 | 2.33 | 3.53 | 5.37 | 7.28 | 9.85 | | 5.37 | |
| NMP | 91.3 | 90.8 | 90.3 | 89.6 | 89.0 | 88.3 | | 8.55 | 91.9 |
| Silica filler | 29.8 | 29.0 | 29.2 | 27.0 | 25.8 | 24.2 | | | 30.7 |

In Table 6, "PAI solution (4-1)" denotes the solution of polyamideimide (4-1) obtained in Preparative Example 9; "PAI solution (4-2)" denotes the solution of polyamideimide (4-2) obtained in Preparative Example 10; and "condensate (5-1)" denotes the glycidyl ether group-containing alkoxysilane partial condensate (5-1) obtained in Preparative Example 11. All values are expressed in grams.

Preparation of Cured Films

Glass plates were coated with the resin compositions obtained in Preparative Examples 12–19 using an applicator (wet 100 μm). The glass plates were dried and cured stepwise in a drier at 80° C. for 30 minutes, at 150° C. for 30 minutes and at 250° C. for 30 minutes. The glass plates were left to cool to room temperature, and the films formed thereon were peeled off from the plates, giving cured films having a thickness of 25 μm.

The coefficients of linear expansion, water absorption capacities and dielectric constants of the obtained cured films were measured in the following manner:

Coefficient of linear expansion: Coefficients of linear expansion of cured films (15 mm width, 20 mm length) was measured at 25–200° C. using a thermal mechanical analyzer (trade name "TMA120C" manufactured by Seiko Instruments Inc.).

Percentage of water absorption: Cured films (10 mm width, 50 mm length) were placed in a thermostatic vessel maintained at 23° C. for 24 hours. Percentage of water absorption of the films was then measured using a Karl Fischer coulometric titrator (trade name: "CA-06", manufactured by MITSUBISHI CHEMICAL CORPORATION) equipped with a vaporizer (trade name "VA-06", manufactured by MITSUBISHI CHEMICAL CORPORATION).

Dielectric constant: The dielectric constant of each cured film (50 mm width, 50 mm length) was measured using a dielectric dissipation factor measuring apparatus (manufactured by KITAHAMA SEISAKUSYO) at a frequency of 1 kHz and a temperature of 23° C.

The test results are shown in Table 7.

TABLE 7

| | Coefficient of linear expansion (ppm · °C.$^{-1}$) | Percentage of water absorption (%) 95% RH-24 h | Dielectric constant (1 kHz, 23° C.) |
| --- | --- | --- | --- |
| Prep. Ex. 12 | 30 | 3.0 | 3.5 |
| Prep. Ex. 13 | 18 | 2.6 | 3.1 |
| Prep. Ex. 14 | 27 | 2.3 | 3.0 |
| Prep. Ex. 15 | 24 | 2.6 | 2.7 |
| Prep. Ex. 16 | 21 | 2.9 | 2.6 |
| Prep. Ex. 17 | 16 | 3.0 | 3.2 |
| Prep. Ex. 18 | 51 | 5.3 | 3.9 |
| Prep. Ex. 19 | 37 | 2.5 | 2.9 |

The silica content in each of the obtained cured films was calculated from the ratio of starting materials. The silica contents in the cured films, i.e., polyamideimide-silica hybrid films, are shown in Table 8.

TABLE 8

| | Silica content (% by weight) |
| --- | --- |
| Prep. Ex. 12 | 38.0 |
| Prep. Ex. 13 | 38.0 |
| Prep. Ex. 14 | 38.0 |
| Prep. Ex. 15 | 38.0 |
| Prep. Ex. 16 | 38.0 |
| Prep. Ex. 17 | 38.0 |
| Prep. Ex. 18 | 4.5 |
| Prep. Ex. 19 | 38.0 |

Examples 22–27, Comparative Examples 10 and 11

Each of the resin compositions obtained in Preparative Examples 12–17 were applied to a flexible substrate produced by forming a copper circuit pattern (18 μm in thickness) on an epoxy resin insulating layer (100 μm in thickness). The application was performed by screen printing. The substrate was dried at 150° C. for 10 minutes and cured at 250° C. for 2 hours to form a polyamideimide-silica hybrid film having a thickness of 50 μm, giving polyamideimide/copper/epoxy resin laminates of Examples 22–27.

In addition, polyamideimide/copper/epoxy resin laminates of Comparative Examples 10 and 11 were prepared in a similar manner except that the resin compositions obtained in Preparative Examples 18 and 19 were used respectively instead.

The thus-obtained laminates were tested for their adhesion between the polyamideimide layer and copper, warpage and cracking in the following manner:

Adhesion: The peel strength of the polyamideimide layer of the laminates to copper was determined according to the method defined in JIS C6481.

Warpage/crack: The laminates were inspected visually and evaluated on the following scale:

A: No warpage was found in the laminate, and no cracks were found in the polyamideimide layer; and B: Warpage was found in the substrate and/or cracks were found in the polyamideimide layer.

The test results are shown in Table 9.

TABLE 9

| Laminate | Peel strength (kg/cm) | Warpage/cracking |
| --- | --- | --- |
| Ex. 22 | 0.6 | A |
| Ex. 23 | 0.6 | A |
| Ex. 24 | 0.7 | A |
| Ex. 25 | 0.7 | A |
| Ex. 26 | 0.8 | A |
| Ex. 27 | 1.0 | A |
| Comp. Ex. 10 | 0.5 | B |
| Comp. Ex. 11 | 1.5 | B |

Example 28

The resin composition obtained in Preparative Example 19 was applied to a flexible substrate produced by forming a copper circuit pattern (18 μm in thickness) on an epoxy resin insulating layer (100 μm in thickness). The application was performed by screen printing. The applied resin compositions was dried at 150° C. for 10 minutes and cured at 250° C. for 2 hours to form a cured film having a thickness of 25 μm. The polyamideimide resin composition obtained in Preparative Example 17 was then further applied to the thus obtained cured film. The applied polyamideimide resin composition was dried at 150° C. for 10 minutes and cured at 250° C. for 2 hours to form a polyamideimide-silica hybrid film having a total thickness of 50 μm, giving a polyamideimide/copper/epoxy resin laminate.

The peel strength (JIS C6481) between the polyamideimide layer and copper of the obtained laminate was 1.3 kg/cm. There was no warpage in the laminate nor cracking in the polyamideimide layer.

The following remarkable effects can be produced according to the present invention:

(1) The present invention provides a polyimide-metal laminate that has excellent interlayer adhesion, dynamic strength and thermal stability, and is resistant to curling and migration of copper ions, by using a specific silane-modified polyimide resin composition for forming the polyimide layer; and (2) The present invention provides a polyamideimide-metal laminate that has excellent interlayer adhesion, dynamic strength, thermal stability and electric insulation, but has little warpage, by using the specific silane-modified polyamideimide resin composition for forming the polyamideimide layer. In addition, this laminate can be produced at low cost.

The invention claimed is:

1. A polyimide-metal laminate that is obtainable by:
applying to one side of a metal foil a silane-modified polyimide resin composition (A) comprising alkoxy-containing silane-modified polyimide (a) prepared by reacting polyamic acid (1) and/or polyimide (2) with epoxy-containing alkoxysilane partial condensate (3) obtained by dealcoholization reaction between an epoxy compound having one hydroxyl group per molecule and an alkoxysilane partial condensate having an average number of silicon atoms per molecule of 2–11, and a polar solvent (b); and
drying the applied composition and curing the dried composition.

2. A polyimide-metal laminate according to claim 1, wherein said polyamic acid (1) and/or polyimide (2) has a percentage of imide cyclization of at least 90%.

3. A polyimide-metal laminate according to claim 1, wherein the silane-modified polyimide resin composition (A) further comprises an inorganic filler (c).

4. A polyimide-metal laminate which is obtainable by further applying a polyimide resin composition (B) comprising polyimide which forms a film having a coefficient of linear expansion of 25 ppm or less and a polar solvent (b) to the polyimide layer of the metal laminate of claim 1, drying the applied composition and curing the dried composition.

5. A polyimide-metal laminate which is obtainable by further applying a silane-modified polyimide resin composition (A) which forms a film having a coefficient of linear expansion of 25 ppm or less to the polyimide layer of the metal laminate of claim 1, drying the applied composition and curing the dried composition.

6. A polyimide-metal laminate having metal layers on both surfaces wherein the metal layer on the polyimide side is formed by metal plating the polyimide film of polyimide-metal laminate of claim 1.

7. A polyimide-metal laminate according to claim 6, wherein the metal plating is copper plating.

8. A polyimide-metal laminate according to claim 1, wherein the curing temperature of the silane-modified polyimide resin composition (A) is 150–500° C.

9. A polyimide-metal laminate according to claim 1, wherein the metal foil is an electrolytic copper foil or a rolled copper foil having a surface roughness (Rz) of 7 or lower and a foil thickness of 70 μm or smaller.

10. A polyimide-metal laminate which is obtainable by applying to a carrier film a silane-modified polyimide resin composition (A) comprising alkoxy-containing silane-modified polyimide (a) prepared by reacting polyamic acid (1) and/or polyimide (2) with epoxy-containing alkoxysilane partial condensate (3) obtained by dealcoholization reaction between an epoxy compound having one hydroxyl group per molecule and an alkoxysilane partial condensate having an average number of silicon atoms per molecule of 2–11, and a polar solvent (b), drying the applied composition, peeling off and curing the dried composition, and metal plating one side or both sides of the obtained cured polyimide film.

11. A polyimide-metal laminate according to claim 10, wherein the silane-modified polyimide resin composition (A) further comprises an inorganic filler (c).

12. A polyimide-metal laminate according to claim 10, wherein the curing temperature of the silane-modified polyimide resin composition (A) is 150–500° C.

13. A polyimide-metal laminate according to claim 10, wherein the metal plating is copper plating.

14. A polyamideimide-metal laminate that is obtainable by:
applying to one side of a metal foil a silane-modified polyamideimide resin composition (C-2) comprising methoxy-containing silane-modified polyamideimide (d) prepared by reacting polyamideimide (4) having terminal carboxyl groups and/or an acid anhydride groups with glycidyl ether group-containing methoxysilane partial condensate (5) obtained by demethanolization reaction between glycidol and a methoxysilane partial condensate, and a polar solvent (b);
drying the applied composition and curing the dried composition;
further applying a silane-modified polyamideimide resin composition (C-1) comprising methoxy-containing silane-modified polyamideimide (d), a polar solvent (b) and an inorganic filler (c) to the resulting polyamideimide layer on the polyamideimide-metal laminate; and
drying the applied composition and curing the dried composition.

15. A polyamideimide-metal laminate according to claim 14, wherein the glycidyl ether group-containing methoxysilane partial condensate (5) is obtainable by demethanolization reaction between glycidol and a methoxysilane partial condensate having an average number of silicon atoms per molecule of 2–100.

16. A polyamideimide-metal laminate according to claim 14, wherein the methoxy-containing silane-modified polyamideimide (d) after curing has a silica content in a cured residue of 1% by weight to less than 15% by weight.

17. A polyamideimide-metal laminate according to claim 14, wherein the polyamideimide layer formed on the metal foil has a percentage of water absorption of less than 3% by weight and a dielectric constant at 1 kHz of 3.5 or lower.

18. A polyamideimide-metal laminate according to claim 14, wherein the polyamideimide layer formed on the metal foil has a coefficient of linear expansion of 15–30 ppm.

19. A polyamideimide-metal laminate according to claim 14, wherein the metal foil is an electrolytic copper foil or a rolled copper foil having a surface roughness (Rz) of 7 or lower and a foil thickness of 70 μm or smaller.

20. A polyamideimide-metal laminate according to claim 14, wherein the curing temperatures of the silane-modified polyamideimide resin compositions (C-1) and (C-2) are in the range of 200–350° C.

21. A flexible printed circuit board comprising a polyamideimide-metal laminate according to claim 14 and a printed circuit.

* * * * *